United States Patent
Schultz

(10) Patent No.: US 6,388,486 B1
(45) Date of Patent: May 14, 2002

(54) LOAD SENSING, SLEW RATE SHAPING, OUTPUT SIGNAL PAD CELL DRIVER CIRCUIT AND METHOD

(75) Inventor: Richard T. Schultz, Fort Collins, CO (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/596,568

(22) Filed: Jun. 19, 2000

(51) Int. Cl.[7] ................................................. H03K 5/12
(52) U.S. Cl. ........................ 327/170; 327/380; 327/381; 327/395
(58) Field of Search ................................. 327/108, 109, 327/134, 170, 380, 381, 392, 393, 401, 161, 175, 176, 271, 276, 277, 284, 395, 400; 326/21, 26, 27, 82, 83

(56) References Cited

U.S. PATENT DOCUMENTS 5,568,081 A * 10/1996 Lui et al. ..................... 327/380
5,877,647 A * 3/1999 Vajapey et al. .............. 327/391
6,160,416 A * 12/2000 Adduci et al. ................ 326/21

* cited by examiner

Primary Examiner—Terry D. Cunningham
Assistant Examiner—Paul Dinh
(74) Attorney, Agent, or Firm—John R. Ley, L.L.C.

(57) ABSTRACT

The slew rate of a digital logic output signal delivered from an output pad of an integrated circuit is controlled relative to a load connected to the output pad. At least two pluralities of trigger signals at sequentially spaced time intervals are generated, and the time intervals between the first and second trigger signals or the temporal occurrence of the first and second trigger signals in relation to the load connected to the output pad is selected to change the slew rate of the output signal. The timing of the plurality of trigger signals is established in relation to an input signal to which the driver circuit responds and in relation to the change in the output signal with time as influenced by the load connected to the output pad.

22 Claims, 9 Drawing Sheets

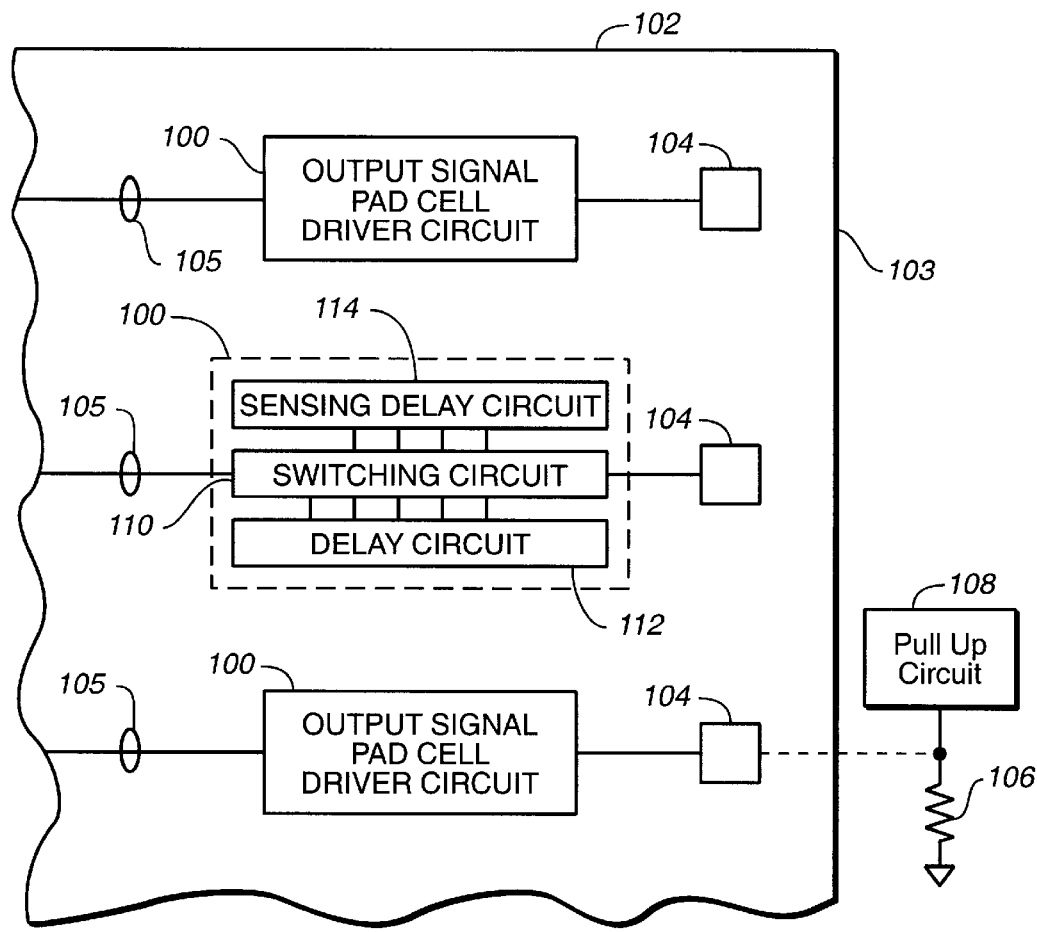
FIG._1
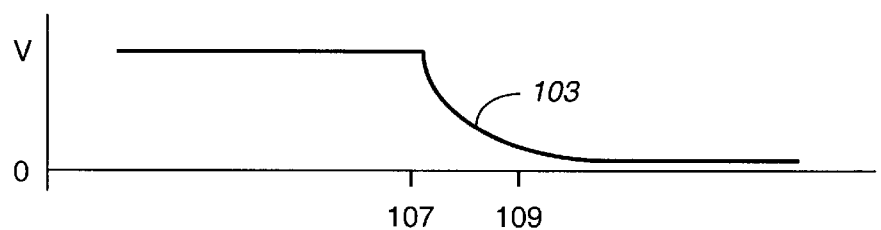
FIG._2
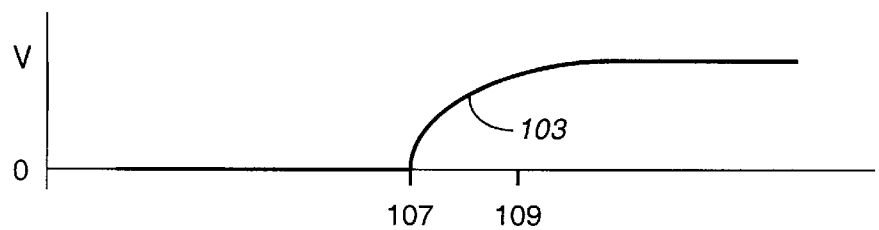
FIG._3

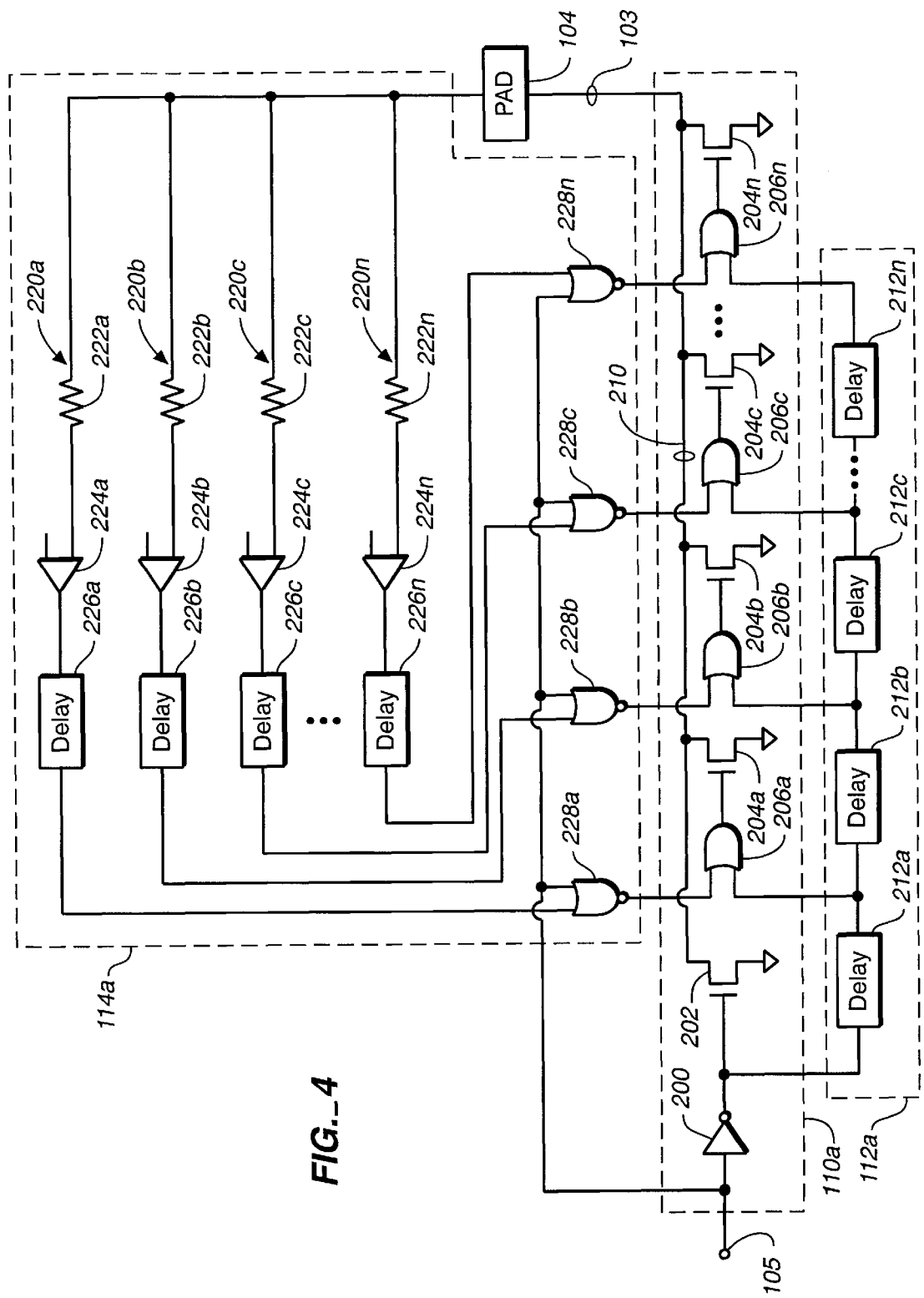
FIG._4

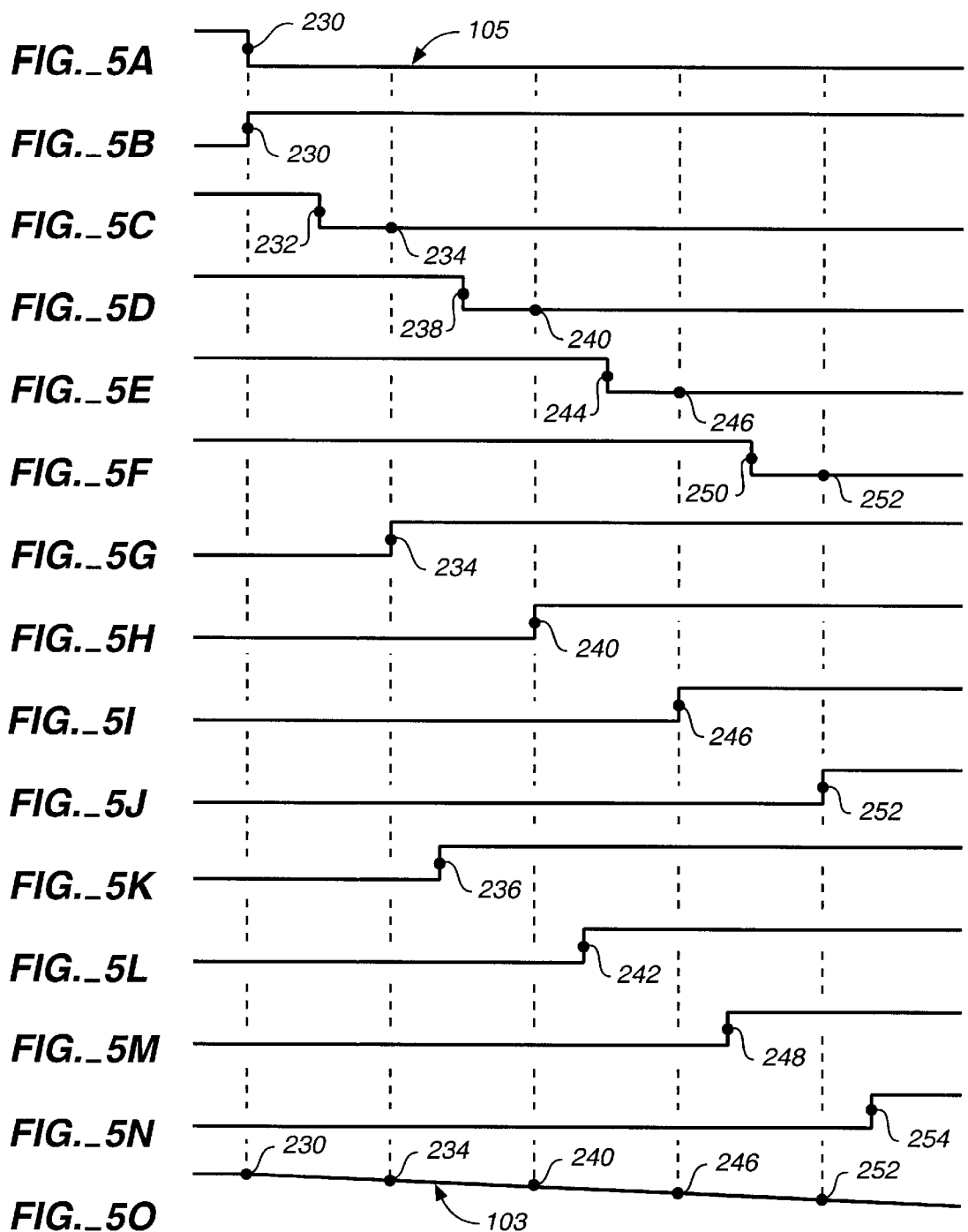

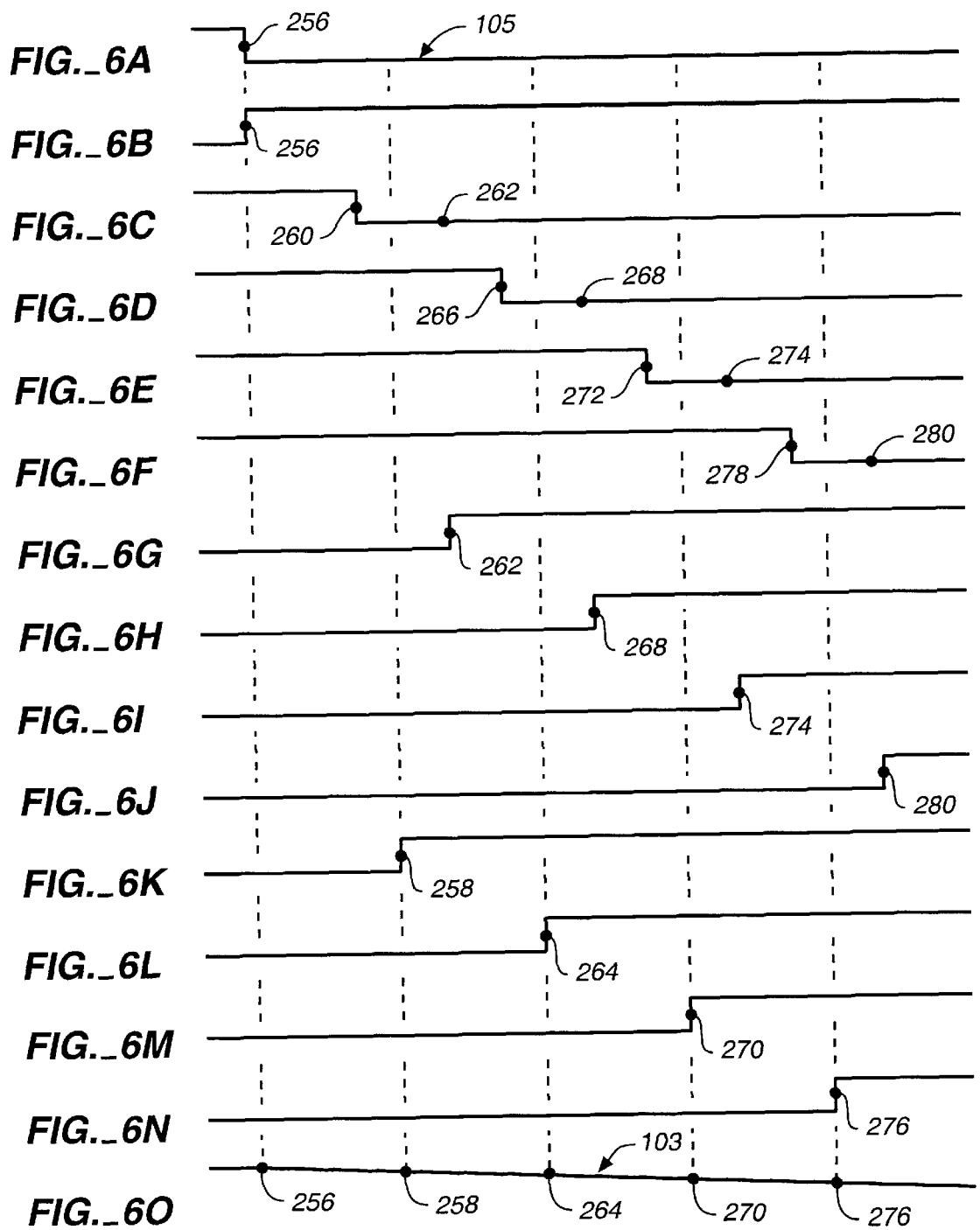

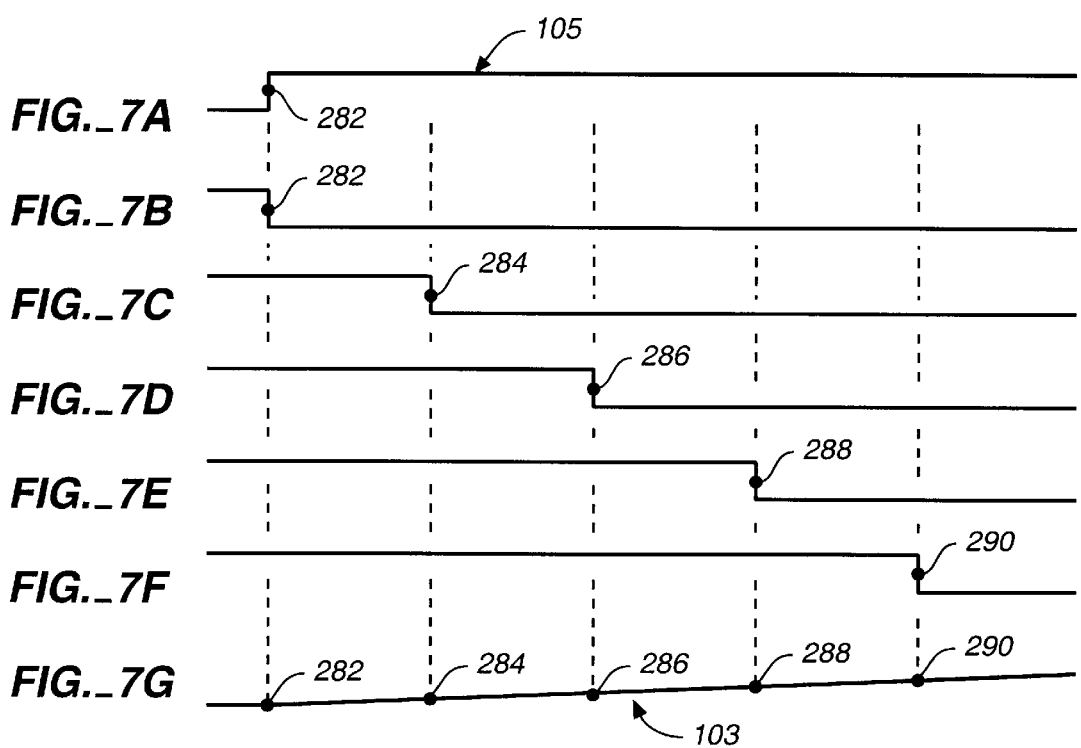
FIG._7A
FIG._7B
FIG._7C
FIG._7D
FIG._7E
FIG._7F
FIG._7G
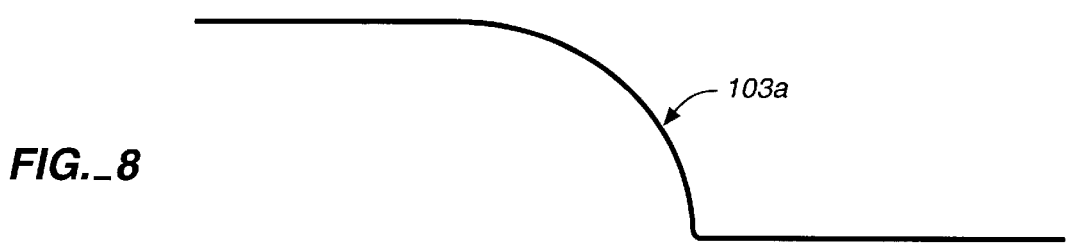
FIG._8
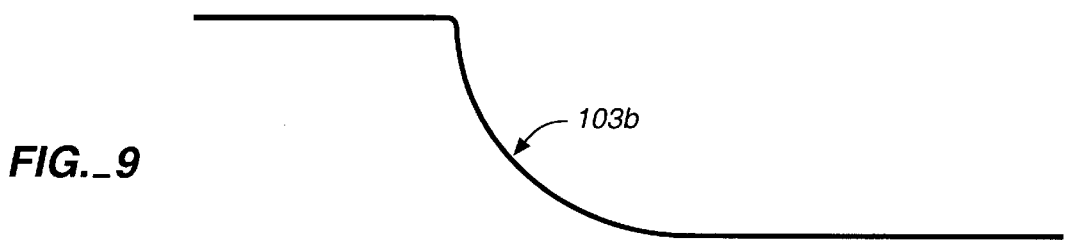
FIG._9

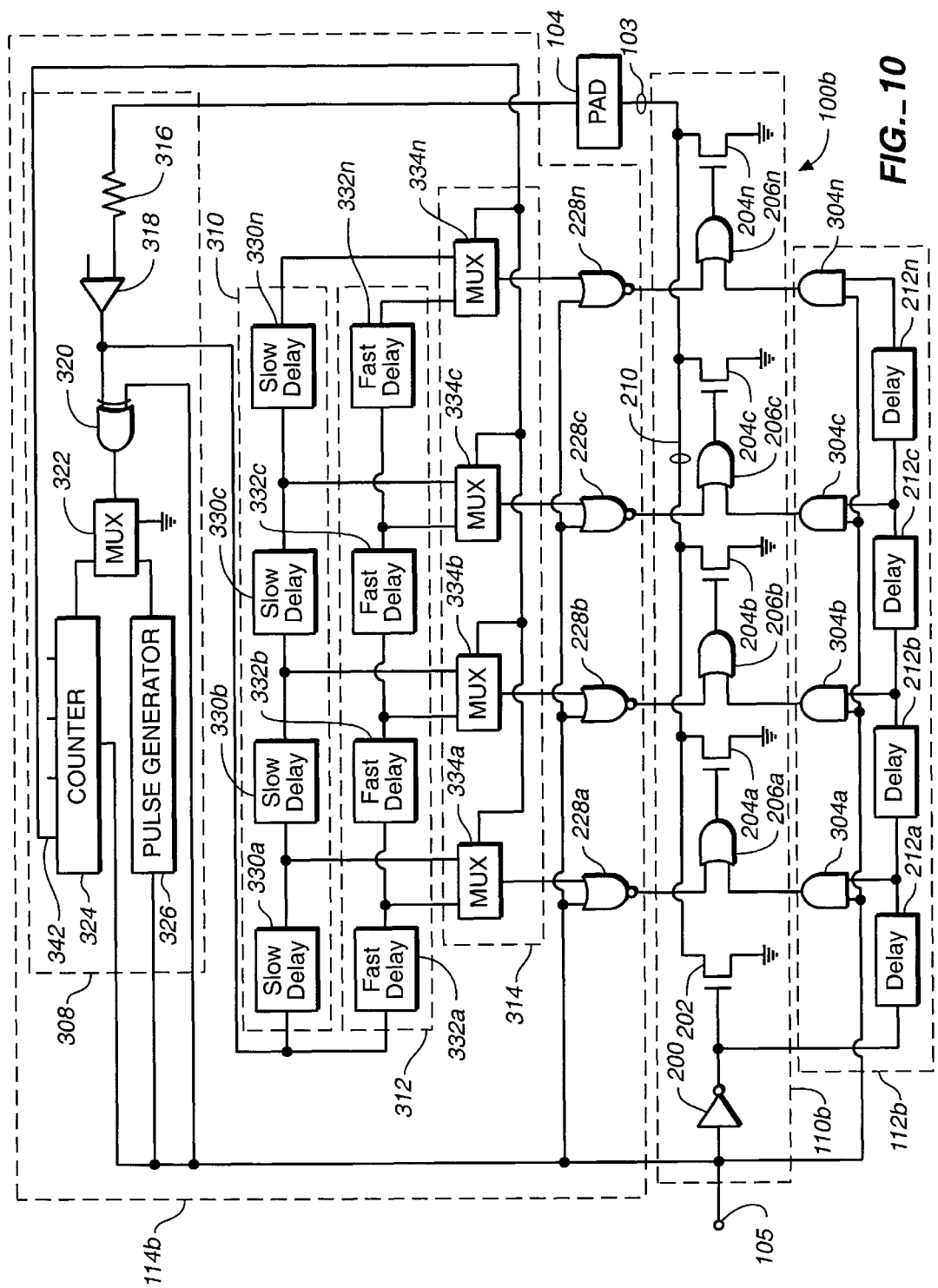
FIG._10

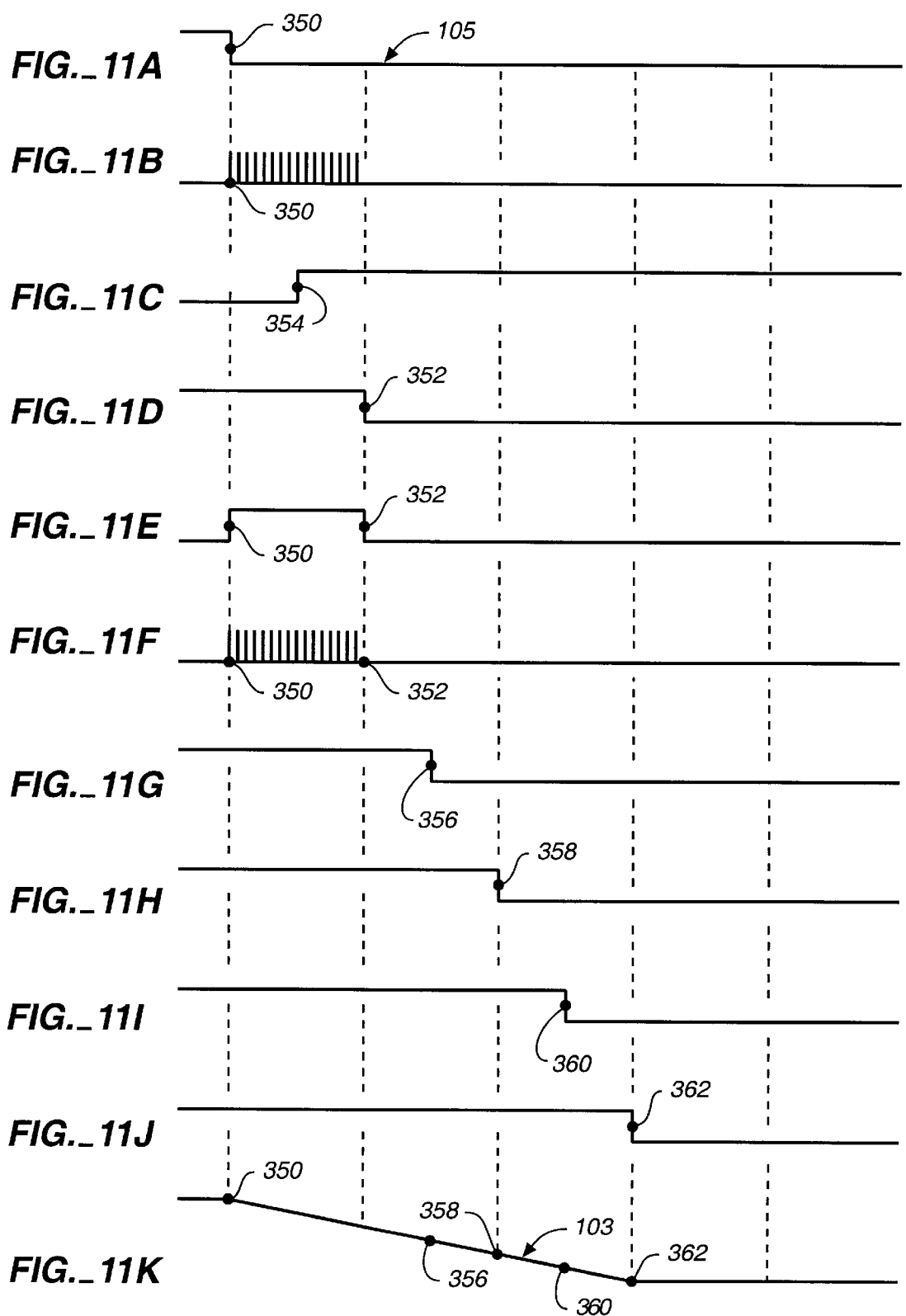

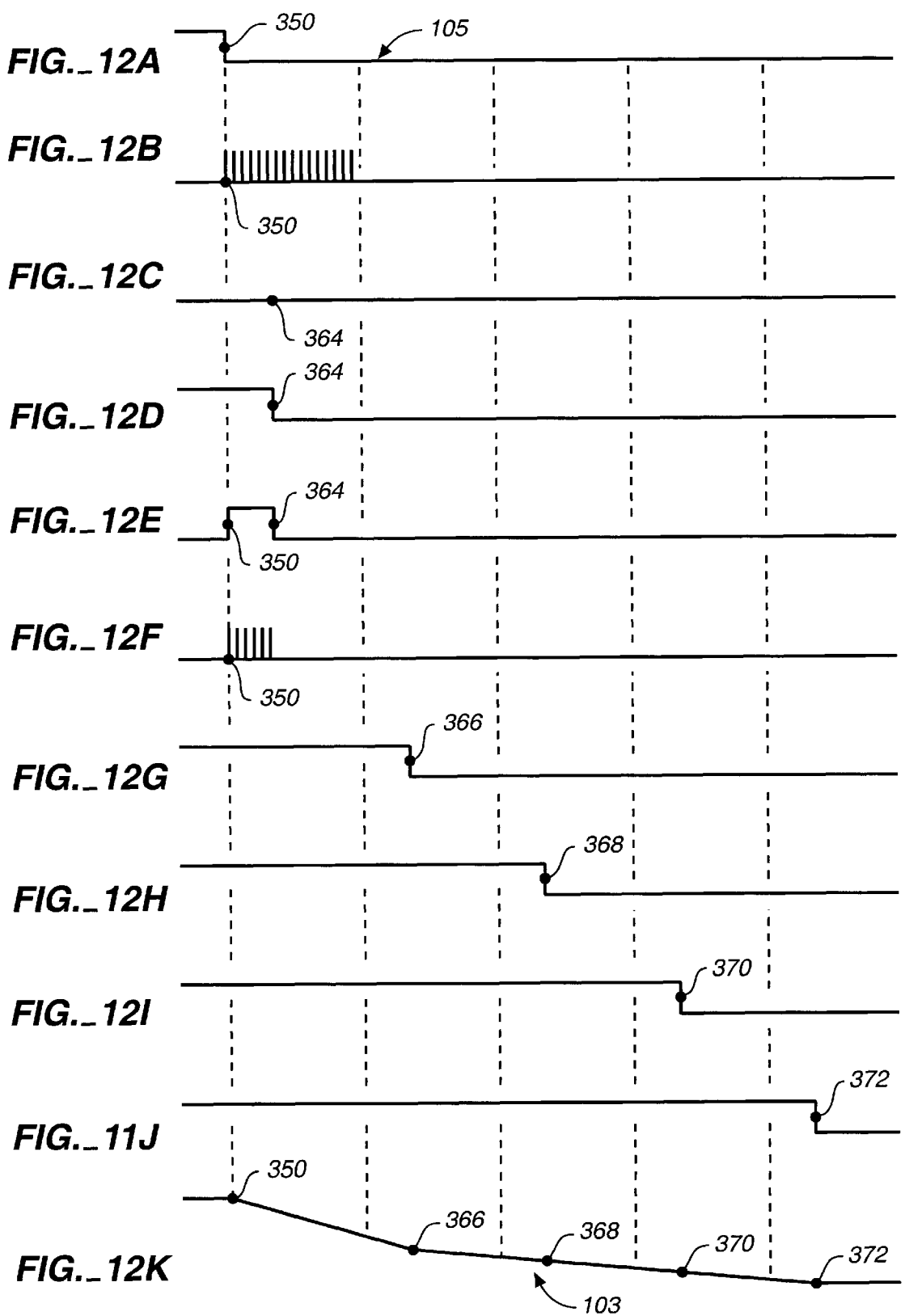

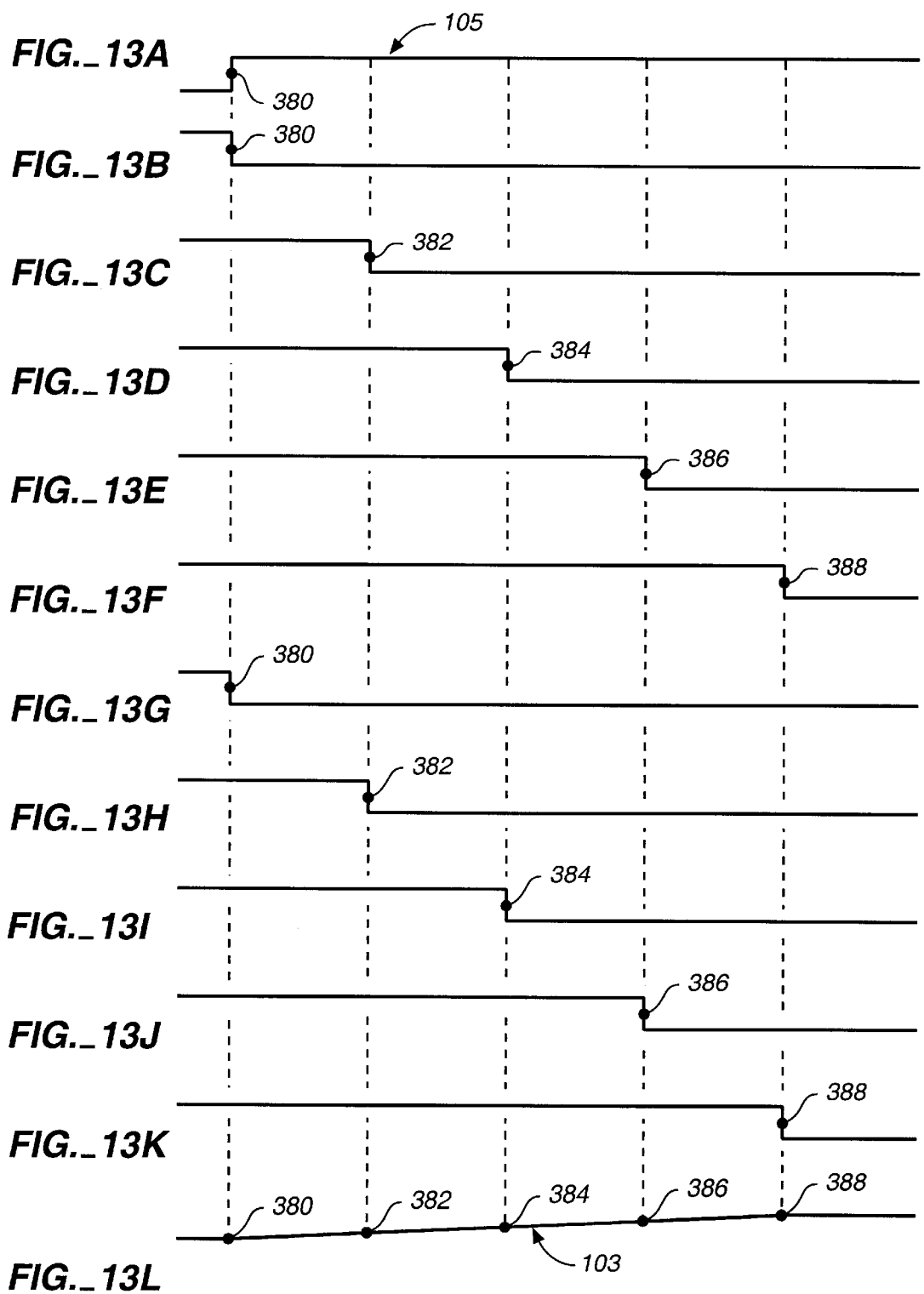

US 6,388,486 B1

LOAD SENSING, SLEW RATE SHAPING, OUTPUT SIGNAL PAD CELL DRIVER CIRCUIT AND METHOD

This invention relates to a semiconductor integrated circuits (ICs) of the type having output signal pad cell driver circuits connected to these output signal pads to control the rise and fall rates, or slew rates, of digital logic signals supplied by the IC. More particularly, the present invention relates to a new and improved output signal driver circuit which automatically selects among multiple delay circuits for changing the slew rate of the digital logic output signals to accommodate variable impedance loads connected to the output pad of the IC.

BACKGROUND OF THE INVENTION

The switching or transition rate of an output signal, referred to as the slew rate, describes the rate at which the voltage of the output signal changes with respect to time (dv/dt). Ideally, the slew rate of the circuit would be infinitely high, causing the output signal to change from one logic state to the other logic state instantaneously. However, due to natural effects and energy storage of the components connected to the output pads of the IC, the logic state cannot change instantaneously. A greater the amount of time required for the output signal to transition from one logic state to the other logic state reduces the switching speed of the IC.

Modern ICs require high switching speeds, and higher switching speeds are made possible by more rapid slew rates. Maintaining high slew rates can be difficult because it is almost impossible to predict the type and amount of impedance or load which may be connected to the output pads of a commercially available IC, particularly any IC which is capable of use in many applications. For example, ICs used in signal communication applications must comply with the applicable communication specifications and protocols. Many of these protocols, such as small computer standard interface (SCSI) and the personal computer interface (PCI) bus interconnect standards, specify drive signal strength, signal delay time from input to output, and the slew rates of the output signal, among other things. It may be particularly difficult to meet these specifications under circumstances where the extent of the load which may be connected to the output pads of a communication IC varies substantially.

To attempt to maintain a high slew rate without regard to the amount of the natural and intended load connected to the output pad of the IC, it is typical that an output signal pad cell driver, such as a transistor or a group of transistors be fabricated as part of the IC to provide the additional energy needed to compensate for the natural output loading effects and to speed up or control the slew rate transition from one logic state to the other. However, if the driver transistors switch logic states too rapidly, the output digital signal may experience degradation problems caused by overshoot, undershoot, or ringing, which in turn, may produce false signals and malfunctions in the IC. Furthermore, if the drivers are switched on and off too quickly, voltage spikes, known as ground bounce, may propagate unwanted voltage transients throughout the IC. Such unwanted voltage transients may also cause aberrant operation.

One solution to the above mentioned problems is to slow the slew rate. However, a diminished slew rate runs counter to the intent of designing faster ICs having more rapid switching times. It is with regard to these and other considerations and problems that the present invention has evolved.

SUMMARY OF THE INVENTION

The present invention involves an output signal pad cell driver circuit of an IC which achieves an increased slew rate and switching speed, while avoiding signal degradation and other problems which may have been previously inherent in achieving increased slew rates and switching speeds. Another feature of the present invention involves sensing the slew rate of the output signal according to the amount of loading or impedance connected to the output signal pad of the IC and adjusting that slew rate based on the initial slew rate to achieve a predetermined slew rate which is more independent of the impedance or loading connected to the output pad. A further feature of the present invention involves selecting and applying multiple different time delay circuit driving capabilities which maintain a predetermined slew rate even under circumstances where different impedances or loads are connected to the output pad. A further feature of the present invention involves selecting and applying multiple different circuit driving capabilities to control the slew rate according to whether the output signal transitions from a logic low to a logic high state in one case or whether the output signal transitions from a logic high to a logic low state in the other case.

To achieve these and other features, an output signal pad cell driver circuit of the present invention controls the slew rate of a digital logic output signal delivered from an output pad of an integrated circuit relative to a load connected to the output pad. The output signal occurs in response to an input digital logic signal. The driver circuit comprises a first timing circuit, a second timing circuit and a switching circuit. The first timing circuit generates a plurality of first trigger signals which occur at sequentially spaced time intervals with respect to one another. The second timing circuit generates a plurality of second trigger signals which occur at sequentially spaced time intervals with respect to one another and at time intervals different from the time intervals of the first trigger signals. One of the timing circuits responds to the input signal to initiate the generation of its plurality of trigger signals, and the other timing circuit responds to the output signal as influenced by the load connected to the output pad to initiate the generation its plurality of trigger signals. The switching circuit includes a plurality of drive switches connected to the output pad and responsive to the pluralities of the first and second trigger signals, with the control signals controlling the conductivity of the drive switches to establish the slew rate of the output signal.

The previously mentioned in other features of the present invention are also achieved by a method of controlling the slew rate of a digital logic output signal delivered from an output pad of an integrated circuit relative to a load connected to the output pad, in response to the occurrence of an input digital logic signal. The method comprises steps including generating a plurality of first trigger signals at sequentially spaced time intervals with respect to one another, in response to the occurrence of the input signal; generating a plurality of second trigger signals at sequentially spaced time intervals with respect to one another and at time intervals different from the time intervals of the first trigger signals; adjusting at least one of the time intervals between the first and second trigger signals or the temporal occurrence of the first and second trigger signals in relation to the load connected to the output pad; selecting one of the pluralities of the first and second signals; and changing the level of the output signal at the output pad in relation to the occurrence of the selected one plurality of second signals by changing the conductivity of a conductivity element connected to the output pad in relation to each trigger signal.

Other preferred aspects of the output signal pad cell driver circuit and the method of controlling the slew rate include circuit elements and method steps, respectively, which permit generating the first ones of the pluralities of the first and second trigger signals at different times, responding to a change in the output signal to deliver one plurality of trigger signals while responding to a change in the input signal to initiate delivery of the other plurality of trigger signals, controlling the application of trigger signals to the drive switches in relation to one of a transition of the input signal from a logic low state to a logic high state or a transition of the input signal from a logic high state to a logic low state, delaying for a predetermined time after the occurrence of the input signal before generating one of the pluralities of trigger signals, and counting a predetermined time after the occurrence of the input signal at which to select the one of the pluralities of trigger signals.

A more complete appreciation of the present invention and its improvements can be obtained by reference to the accompanying drawings, which are briefly summarized below, by reference to the following detailed description of presently preferred embodiments of the invention, and by reference to the appended claims.

BRIEF DESCRIPTION OF THE DRAWINGS

FIG. 1 an illustration of a portion of an integrated circuit, showing three output signal pad cell driver circuits incorporating the present invention.

FIGS. 2 and 3 are waveform diagrams of an output signal from an output signal pad cell driver circuit shown in FIG. 1, transitioning from a logic high level to a logic low level and from a logic low level to a logic high level, respectively.

FIG. 4 is a block and schematic diagram of one embodiment of an output signal pad cell driver circuit shown in FIG. 1.

FIGS. 5A to 5O, 6A to 6O and 7A to 7G are groups of waveform diagrams of signals at different locations within the output signal pad cell driver circuit shown in FIG. 4, with each group of waveforms having a common time reference.

FIGS. 8 and 9 are waveform diagrams illustrating the slew rate of an output signal from the output signal pad cell driver circuit shown in FIG. 4, achieved by adjusting the size of drive transistors of the driver circuit.

FIG. 10 is a block and schematic diagram of an alternative embodiment of an output signal pad cell driver circuit shown in FIG. 4.

FIGS. 11A to 11K, 12A to 12K and 13A to 13L are groups of waveform diagrams of signals at different locations within the output signal pad cell driver circuit shown in FIG. 10, with each group of waveforms having a common time reference.

DETAILED DESCRIPTION

The present invention is incorporated in an output signal pad cell driver circuit 100, each of which is a part of an integrated circuit (IC) 102, and each of which is connected to an output signal pad 104 of the IC 102, as shown in FIG. 1. Output signals are delivered from the output pads 104 to an external load, represented by resistor 106, connected to each output pad 104. Typically, a lead (not shown) is connected to the output pad 104 to conduct the output signal to pins of a conventional IC package (also not shown) in which the IC 102 is housed. The pins or other conductive elements of the IC package are connected to the external circuitry, e.g. resistor 106, by a printed circuit board or other conventional connection element.

In addition to the external load, e.g. resistor 106, a conventional, external "pull up" circuit 108 is typically connected to each output pad 104. The pull up circuit 108 is part of the external circuitry to which the IC 102 and its package are connected. The pull up circuit 108 normally supplies a logic high level voltage signal at the output pad 104 and to the load 106. The output signal pad cell driver circuit 100 overpowers the pull up circuit 108 and reduces the voltage from the pull up circuit 108 to create a logic low level signal at the output pad 104. Similarly, the output signal pad cell driver circuit 100 allows the pull up circuit 108 to elevate the voltage at the output pad 104 to create a logic high level signal.

The output signal pad cell driver circuit 100 responds to an input digital logic signal 105 originating from other logic circuitry of the IC 102. The driver circuit 100 causes an output signal 103 (FIGS. 2 and 3) at the output pad 104 to assume a logic level related to the logic state of the input signal at 105. The slew rate of the output signal at pad 104 is the transition between different logic states, in response to a transition of the input signal at 105. As shown in FIGS. 2 and 3, the output signal 103 at the output pad 104 (FIG. 1) begins a transition at point 107 which is completed at point 109. The curvature of the output signal 103 between the points 107 and 109 is the slew rate. A shorter amount of time between points 107 and 109 indicates a greater or more rapid slew rate.

The output signal pad cell driver circuit 100 responds to the input digital logic signal at 105 (FIG. 1) which is applied at point 107. The transition of the input signal is usually completed well before point 109, because the input signal is not subject to the load connected to the output pad 104, and it is the load which usually delays the transition of the output signal 103. The driver circuit 100 controls the slew rate of the output signal 103 in transitions from the logic high level to the logic low level, as shown in FIG. 2. In this case, the driver circuit 100 must dissipate and overcome the voltage supplied by the pull up circuit 108. Similarly, in the case of a transition from the logic low level to the logic high level as shown in FIG. 3, the driver circuit 100 controls the slew rate of the output signal 103. The pull up circuit 108 adds energy to raise the level of the output signal while the driver circuit 100 becomes nonconductive.

The output signal driver circuit 100 comprises a switching circuit 110, first delay circuit 112, and a second slew rate sensing delay circuit 114. In general, the switching circuit 110 drives the output signal at the pad 104 to its desired logical level. Delay circuits 112 and 114 control the slew rate at which switching circuit 110 drives the transitions of the output signal at the pad 104.

More details concerning two embodiments 100a and 100b of the driver circuit 100 are shown and described in FIGS. 4 and 10, respectively. A number of components employed in the driver circuit embodiments 100a and 100b are associated with one another and are referenced by like alphabetical letters attached to numerical references. The number and size of these associated components may be replicated as desired to achieve the size and output signal slew rate control characteristics desired. Four of these associated components is represented by the designations a, b, c and n in FIGS. 4 and 10, with n being indicative of the highest number of such components. The actual number n of components which may be replicated must be at least one.

The output signal pad cell driver circuit embodiment 100a shown in FIG. 4 comprises a switching circuit 110a, a delay circuit 112a, and a sensing feedback delay circuit 114a. Both delay circuits are connected to and control the switching circuit 110a.

The switching circuit 110a comprises a series of NMOS drive transistors 202, 204a, 204b, 204c and 204n which are rapidly driven in a turn-on sequence or in a turn-off sequence, to transition the output signal at pad 104 between a logic high and a logic low state. Time delay elements of the delay circuits 112a and 114a control the timing sequence of the drive transistors as a switch during each transition. As the drive transistors 202, 204a, 204b, 204c and 204n become conductive, they dissipate the voltage from the pull up circuit 108 (FIG. 1) and cause the voltage level at the output pad 104 to diminish to a logic low state. As the drive transistors 202, 204a, 204b, 204c and 204n become nonconductive, they allow the voltage from the pull up circuit 108 (FIG. 1) to increase the voltage level, at the output pad 104 to achieve a logic high state.

The delay circuit 112a controls the slew rate when the output signal 103 transitions from a logic low state to a logic high state (FIG. 3). Both delay circuits 112a and 114a are responsive in a transition from a logic high state to a logic low state (FIG. 2), but one of the delay circuits 112a or 114a predominates over the other two control the slew rate, depending upon the load connected to the output pad 104. The delay circuit 112a controls the slew rate of output signal transitions under conditions where the output load is relatively heavy, meaning that the value of resistor 106 (FIG. 1) is relatively low. The delay circuit 114a controls the slew rate of output signal transitions under conditions where the output load is relatively light, meaning that the value of resistor 106 (FIG. 1) is relatively high. The delay circuit 114a responds to the initial slew rate of the logic high to logic low transition to assert its delay timing for sequentially turning on the drive transistors of the switching circuit 110a when the initial slew rate sensed by the feedback delay circuit 114a indicates relatively light loading. Conversely, when the slew rate associated with a relatively heavy capacitive load is sensed by the feedback delay circuit 114a, the sequential timing delays for controlling the drive transistors from the feedback delay circuit 114a fall temporally behind the sequential timing delays of the delay circuit 112a, thereby allowing the delay circuit 112a to control the sequential timing for turning on the drive transistors and controlling the slew rate under relatively heavy load conditions.

The switching circuit 110a of the embodiment 100a comprises an inverter 200, and the NMOS drive transistors 202, 204a, 204b, 204c and 204n. OR gates 206a, 206b, 206c and 206n are connected to the gates of drive transistors 204a, 204b, 204c and 204n, respectively, to control the application of switching signals to those drive transistors. The input terminal 105 of the driver circuit 100a is connected to an input terminal of the inverter 200. An output terminal of the inverter 200 is connected to the gate of transistor 202. Drive transistors 202, 202a, 202b, 202c and 202n have their sources connected to a ground reference, and their drains are connected to conductor 210. Conductor 210 is connected to the output pad 104. The state of conductivity of the drive transistors influences the output signal level at the pad 104.

An input signal applied at input terminal 105 is immediately inverted by the inverter 200 and applied to the gate terminal of the transistor 202, causing an immediate effect on the conductive characteristics of transistor 202. This initial conductivity is sensed by the sensing feedback delay circuit 114a, which initially establishes its functionality. The input signal, after inversion by the inverter 200, is also applied to the delay circuit 112a which establishes its functionality.

The delay circuit 112a comprises a number of conventional signal delay elements 212a, 212b, 212c and 212n, each having one input terminal and one output terminal. The delay elements 212a, 212b, 212c and 212n are connected in series, with the output terminal of the inverter 200 connected to the input terminal of the delay element 212a. The output terminal of each delay element 212a, 212b and 212c is connected to the input terminal of the next delay element in the series. The output terminal of each delay element 212a, 212b, 212c and 212n is also connected to one input terminal of the corresponding OR gates 206a, 206b, 206c and 206n, respectively. As a result of these connections, a logic high signal asserted at the input terminal of a delay element 206a, will, after a predetermined delay time caused by that delay element 206a, cause a logic high to be asserted at both the input terminal of the OR gate 206a and at the input terminal of the next series delay element 212b. Similar functionality is achieved by the other delay elements 212b, 212c and 212d. In this way, the delay elements 212a, 212b, 212c and 212n will assert high logic signals on the input terminals of OR gates 206a, 206b, 206c and 206n, in sequential, time-delayed order. These high logic signals will be sequentially conducted through the OR gates 206a, 206b, 206c and 206n to the gates of transistors 204a, 204b, 204c and 204n, thereby turning on the drive transistors 204a, 204b, 204c and 204n in the same sequential, time-delayed order. Preferably, each of the delay elements 212a, 212b, 212c and 212n establish the same predetermined time delay for the signals conducted through them.

The sensing feedback delay circuit 114a comprises a number of separate, parallel-connected, series delay branches 220a, 220b, 220c and 220n. Each delay branch comprises a resistor 222, a comparator 224, a delay element 226 and a two input NOR gate 228, connected in series. The resistors, comparators, delay elements and NOR gates of the delay branches 220a, 220b, 220c and 220n are separately identified by alphabetical letters which correspond to the alphabetical identification of the one of the delay branches 220a, 220b, 220c and 220n within which those elements are series-connected.

Each resistor 222a, 222b, 222c and 222n is connected at one terminal to output pad 104 and at the other opposite terminal to an input terminal of its series connected comparator 224a, 224b, 224c and 224n, respectively. An output terminal of each comparator 224a, 224b, 224c and 224n is connected to an input terminal of the associated delay element 226a, 226b, 226c and 226n, respectively. An output terminal of each delay element 226a, 226b, 226c and 226n is connected to one input terminal of NOR gates 228a, 228b, 228c and 228n, respectively. An output terminal of each NOR gate 228a, 228b, 228c and 228n is connected to an input terminal of its associated OR gate 206a, 206b, 206c and 206n, respectively, of the switching circuit 110a. Finally, the input terminal 105 is connected to the other input terminal of each NOR gate 228a, 228b, 228c and 228n.

Each comparator 224a, 224b, 224c and 224n, is preferably set to trip, or turn on, and produce a high logic state at its output terminal when a predetermined trip point voltage level is present at its variable voltage input terminal. Conversely, each comparator 224a, 224b, 224c and 224n will turn off and produce a low logic state at its output terminal when the voltage at the input terminal is below the trip point voltage. Comparator 224a may have a higher trip point voltage than comparator 224b, for example at about 80 percent of the voltage of the logic high level; comparator 224ba may have a higher trip point voltage than comparator 224c, for example at about 60 percent of the voltage of the logic high level; comparator 224c may have a higher trip point voltage than comparator 224n, for example at about 40 percent of the voltage of the logic high level; and the comparator 224n may have the lowest trip point voltage, for example at about 20 percent of the voltage of the logic high level. In this way, as the output voltage at the pad 104, and at the input terminals of the comparators 224a, 224b, 224c and 224n, drops from a logic high state value above the trip point voltage of comparator 224a to a logic low state value below the trip point voltage of comparator 224n, the comparators 224a, 224b, 224c and 224n will deliver logic low signals at the input terminal of delay elements 226a, 226b, 226c and 226n, in time-delayed sequence related to be values of their trip point voltages.

In response to the logic low state values from the comparators and after a further time delay caused by delay elements 226a, 226b, 226c and 226n, a logic low signal will occur at the output terminals of these delay elements. The logic low signals from the delay elements are applied to the input terminals of the NOR gates 228a, 228b, 228c and 228n. A logic low signal is also present at the other input terminal of these NOR gates 228a, as a result of a logic low level input signal at 105. Consequently, a logic high signal will be asserted from the NOR gates 228a, 228b, 228c and 228n to the OR gate 206a, 206b, 206c and 206n. The logic high signals from these OR gates cause the drive transistors 204a, 204b, 204c and 204n to turn on in sequence, with the time delay between each drive transistors turning on being established by the trip point voltage is of the comparators 224a, 224b, 224c and 224n and the time delays of the delay elements 226a, 226b, 226c and 226n. Thus, each of the delay branch circuits 220a, 220b, 220c and 220n have the capability to invoke to separate time delays, one time delay from the trip point of the comparators and the other from the delay elements 226a, 226b, 226c and 226n.

The delay times of delay elements 212a, 212b, 212c and 212n and delay elements 226a, 226b, 226c and 226n are selected such that when a relatively light load (high impedance) is connected to output pad 104, the branch circuits 220a, 220b, 220c and 220n will assert logic highs on the input terminals to OR gates 206a, 206b, 206c and 206n, respectively, before logic highs are asserted through these same OR gates by delay elements 212a, 212b, 212c and 212n, respectively. In this case, the time delays created by the sensing feedback circuit 114a control the slew rate. Conversely, the delay times for the delay elements 212a, 212b, 212c and 212n and delay elements 226a, 226b, 226c and 226n are selected such that when a relatively heavy load (low impedance) is connected to output pad 104, delay elements 212a, 212b, 212c and 212n will assert logic highs on the input terminals to OR gates 206a, 206b, 206c and 206n, respectively, before branch circuits 220a, 220b, 220c and 220n do so. The sensing capability of the initial slew rate by the feedback delay circuit 114a controls the relative timing of the trigger signals supplied through the OR gates 206a, 206b, 206c and 206n, to allow the trigger signals from one of the delay circuits 112a or 114a to predominate temporally over the other and control the slew rate. Of course, selection of the values of the delay elements may reverse the functional roles of the delay circuits 112a and 114b, compared to those just described.

In order to select the values of the delay elements to achieve the desired operation, the range of possible imped-ances at the output pad 104 must be known. Additionally, the various specifications or protocols of the devices to which the IC 102 will be connected must be known. Once the output impedance range and the specifications of the device to which the IC 102 will be connected are known, either manual calculations or computer based circuit simulation may be used to assist in the selection of the time delay components.

Details regarding the operation of driver circuit 100a are further shown by the waveform diagrams of FIGS. 5A through 5O, which illustrate waveforms at various points in the output signal pad cell driver circuit 100a when the output pad 104 (FIG. 4) is connected to a relatively light load.

Initially, prior to time point 230, a high voltage or logic high signal exists at the input terminal 105, and a logic high output signal 103 exists at output pad 104, as shown in FIGS. 5A and 5O, respectively. The high to low transition of the input signal 105 at time point 230 (FIG. 5A) results in a corresponding a logic low signal (FIG. 5B) at the input terminals of NOR gates 228a, 2228b, 228c and 228n, thereby enabling those NOR gates and allowing the sensing feedback delay circuit 114a to contend with the delay circuit 112a to control the slew rate. The logic high signal from the inverter 200 causes the drive transistor 202 to become conductive at time point 230, causing the output signal 103 to begin to fall (FIG. 5O).

The decrease in the output signal 103 (FIG. 5O) causes a corresponding voltage drop at the input terminals of the comparators 224a, 224b, 224c and 224n. When the voltage at the input of comparator 224a drops below its trip point at time point 232 (FIG. 5C), the comparator 224a turns off, causing a low logic state signal to be asserted at the input of delay element 226a. After a predetermined time delay to time point 234 established by the delay element 226a, a logic low signal is asserted on an input terminal of the NOR gate 228a. Since both input signals to the NOR gate 228a are now low, output signal of the NOR gate 228a will go high (FIG. 5G), thus asserting a logic high signal to the input terminal of the OR gate 206a. A high output signal from the OR gate 206a turns on transistor 204a. As a result of transistor 204a turning on, a further voltage drop of the output signal 103 (FIG. 5O) will occur at time point 234 or at the output pad 104, beyond that created by the conductive driver transistor 202.

A short time after transistor 204a is turned on, the signal (FIG. 5K) at the output terminal of delay element 212a will go high as a result of the time delay to time point 236 established by the delay elements 212a, thus asserting a logic high on the input terminal of OR gate 206a. However, since a logic high is already present at the input terminal of OR gate 206a from the NOR gate 228a, the logic high signal from the delay element 212a will have no further affect on the conductivity of the drive transistor 204a.

As the output signal 103 (FIG. 5O) continues to drop to the lower trip point of comparator 224b, at time point 238 (FIG. 5D) comparator 224b turns off, causing a logic low at the input of delay element 226b. After a further predetermined time delay to time point 240 (FIG. 5H), delay element 226b will assert a logic low signal on the input terminal of NOR gate 228b. An output signal (FIG. 5H) of NOR gate 228b will then go high, thus asserting a logic high signal on the input terminal of OR gate 206b. The high signal at the output terminal of OR gate 206b turns on transistor 204b, causing a further voltage drop on signal 242 (FIG. 5O) at time point 240.

A short time after transistor 204b is turned on, after a time delay to time point 242 established by delay elements 212a and 212*b*, a signal (FIG. 5L) at the output terminal of delay element 212*b* will go high, asserting a logic high at the input terminal of OR gate 206*b*. Since a logic high is already present at input terminal of OR gate 206*b*, the logic high signal from the delay element 212*b* will have no further affect on the conductivity of the drive transistor 204*b*.

As the output signal 103 (FIG. 50) continues dropping and reaches the trip point of comparator 224*c* at time point 244 (FIG. 5E), comparator 224*c* turns off, causing a logic low at the input of delay element 226*c*. Delay element 226*c* will then assert a logic low input signal to the NOR gate 228*c*, after the further time delay to time point 246, causing an output signal (FIG. 51) of the NOR gate 228*c* to go high. The NOR gate 228*c* asserts a logic high signal (FIG. 51) as an input to the OR gate 206*c*, and a high signal at the output terminal of OR gate 206*c* turns on transistor 204*c* and causes a further voltage drop of the output signal 103 (FIG. 50), at time point 246.

A short time after transistor 204*c* is turned on, at the time delay point 248 established by delay elements 212*a*, 212*b* and 212*c*, an output signal (FIG. 5M) at the output terminal of delay element 212*c* will go high, asserting a logic high signal at the other input terminal of the OR gate 206*c*. Since a logic high signal is already present at input terminal of the OR gate 206*c*, the logic high signal from the delay element 212*c* will have no further affect on the conductivity of the drive transistor 204*c*.

As the output signal 103 (FIG.50) continues dropping to the trip point of comparator 224*n* at time point 250, comparator 224*n* turns off, causing a logic low at the input terminal of delay element 226*n*. After the delay element 226*n* causes a further time delay to time point 252 (FIG. 5J), the delay element 226*n* then asserts a logic low signal on the input terminal of NOR gate 228*n*. An output signal of NOR gate 228*n* then goes high, asserting a logic high on an input terminal of OR gate 206*n*, and causing the signal at the output terminal of OR gate 206*n* to go high (FIG. 5J), turning on transistor 204*n* and causing a further voltage drop of the output signal 103 (FIG. 50).

A short time after transistor 204*n* is turned on, at time point 254 (FIG. 5N) established by the cumulative delay of the delay elements 212*a*, 212*b*, 212*c* and 212*n*, an output signal from the delay element 212*n* will go high, asserting a logic high signal at the other input terminal of the OR gate 206*n*. Since a logic high signal is already present at input terminal of the OR gate 206*n*, the logic high signal at the other input terminal of OR gate 206*n* will have no further affect on the conductivity of the drive transistor 206*n*.

The drive transistors 202, 204*a*, 204*b*, 204*c* and 204*n* are now all conductive, and as shown in FIG. 50, the output signal 103 has transitioned to a logic low level.

The operation of the driver circuit 100*a* is further shown by the waveform diagrams of FIGS. 6A through 60, which illustrate waveforms at various points in the driver circuit 100*a* (FIG. 4) when the output pad 104 is connected to a relatively heavy load (low impedance).

Initially, prior to time point 256 a high voltage or logic high signal exists at the input terminal 105, and a logic high output signal 103 exists at output pad 104, as shown in FIGS. 6A and 60, respectively. The high to low transition of the input signal 105 at time point 256 results in a corresponding a logic low signal at the input terminals of NOR gates 228*a*, 2228*b*, 228*c* and 228*n*, thereby enabling those NOR gates and allowing the sensing feedback delay circuit 114*a* to contend with the delay circuit 112*a* to control the slew rate. The logic low signal at the input terminal 105 is inverted by the inverter 200, causing the drive transistor 202 to become conductive at time point 256, causing the output signal 103 to begin to fall (FIG. 60).

At a predetermined time 258 (FIG. 6K) established by the delay element 212*a* after a logic low has been asserted on its input terminal, the output signal from the delay element 212*a* will go high (FIG. 6K), asserting a logic high on the input terminal of delay element 212*b* and on the input terminal of the OR gate 206*a*. As a result of the logic high input signal applied to the OR gate 206*a*, its output signal will go high, causing transistor 204*a* to turn on. As a result, a further voltage drop of the output signal 103 (FIG. 60) will occur at time point 258.

The decrease in the output signal 103 (FIG. 60) beginning at time point 256 causes a corresponding voltage drop at the input terminals of the comparators 224*a*, 224*b*, 224*c* and 224*n*. When the voltage at the input of comparator 224*a* drops below its trip point at time point 260 (FIG. 6C), the comparator 224*a* turns off, causing a low logic state signal to be asserted at the input of delay element 226*a*. By comparing time points 260 and 232 shown in FIGS. 6C and 5C, respectively, it is apparent that the heavy load connected to the output pad 104 has caused a greater time delay for the output voltage drop to the trip point of the comparator 224*a*, at time point 260 (FIG. 6C). After a predetermined time delay to time point 262 established by the delay element 226*a*, a logic low signal is asserted on an input terminal of the NOR gate 228*a*, causing the NOR gate 228*a* to deliver a logic high signal (FIG. 6G) to the OR gate 206*a*. However, since a logic high signal is already present at the input terminal of the OR gate 206*a* from the output signal of the delay element 212*a*, the logic high signal from the NOR gate 228*a* will have no further affect on the conductivity of the transistor 204*a*, since the drive transistor 204*a* has previously been conducting since time .258 (FIG. 6K).

At a predetermined time delay after the logic low signal has been asserted on the input terminal of delay element 212*b* to point 264 (FIG. 6L), as established by the delay element 212*b*, the output signal from the delay element 212*b* will go high at time point 264 (FIG. 6L). A logic high signal will be asserted on the input terminal of delay element 212*c* and on the input terminal of the OR gate 206*b*. As a result of the logic high on the input terminal of the OR gate 206*b*, transistor 204*b* will become conductive, causing a further drop of the output signal 103 (FIG. 60), at time point 264.

As the output signal 103 (FIG. 60) drops below the trip point of comparator 224*b* at time point 266, comparator 224*b* will turn off (FIG. 6D), causing a logic low signal at the input terminal of the delay element 226*b*. After a predetermined time delay to time point 268 established by the delay element 226*b*, a logic low signal will be supplied to the input terminal of the NOR gate 228*b*. An output signal from the NOR gate 228*b* will then go high (FIG. 6H), asserting a logic high signal to the input terminal of the OR gate 206*b*. Since a logic high signal is already present at the other input terminal of the OR gate 206*b*, the logic high signal from the NOR gate 228*b* will have no further affect on the output signal 103, because the drive transistor 204*b* has previously been conducting since time point 264 (FIG. 6L).

A predetermined time point 270 (FIG. 6M) after a logic low has been asserted on the input terminal of delay element 212*c*, an output signal from the delay element 212*c* will go high, thus asserting a logic high on the input terminal of delay element 212*n* and on one input terminal of the OR gate 206*c*. As a result, the transistor 204*c* will be biased into a conductive state at time point 270, causing a further drop in the output signal 103 (FIG. 60), at time point 270.

As the output signal 103 decreases to the trip point of comparator 224c at time point 272 (FIG. 6E), comparator 224c will turn off, causing a logic low signal at the input terminal of delay element 226c (FIG. 6E). After a predetermined time delay to time point 274, established by the delay element 226c, a logic low signal will be asserted on one input terminal of the NOR gate 228c. The output signal of NOR gate 228c will then go high at time point 274 (FIG. 6I), asserting a logic high on the other input terminal of the OR gate 206c. Since a logic high is already present at one input terminal of OR gate 206c, the logic high signal from the NOR gate 228c will have no further affect, since the drive transistor 206c has previously commenced conducting at time point 270.

Finally, at time delay to time point 276 (FIG. 6N) established by the delay element 212n, an output signal from the delay element 212n will go high at time point 276 (FIG. 6N), thus asserting a logic high signal one input terminal of the OR gate 206n. As a result of the bias signal supplied by the OR gate 206n, transistor 204n turns on, causing a further voltage drop of the output signal 103 (FIG. 60), at time point 276.

As the output signal 103 (FIG. 60) drops below the trip point of comparator 224n at time point 278, comparator 224n will turn off, causing a logic low signal at the input terminal of delay element 226n. After a predetermined time delay to time point 280, established by the delay element 226n, a logic low signal is asserted to an input terminal of the NOR gate 228n. An output signal of NOR gate 228n will then go high at time point 280 (FIG. 6J), asserting a logic high signal has an input to the OR gate 206n. Since a logic high is already present at input terminal of OR gate 206n since time point 276, the logic high signal supplied to the OR gate 206n will have no further affect on the conductivity of the drive transistor 206n at time point 280.

At this point, output signal 103 (FIG. 60) has reached a logic low. The drive transistors 202, 204a, 204b, 204c and 204n are now all conductive and, as shown in FIG. 60, the output signal 103 (FIG. 60) is at a logic low state.

The operation of the driver circuit 100a (FIG. 4) when the driver transistors 202, 204a, 204b, 204c and 204n are being turned off is shown by the waveform diagrams of FIGS. 7A through 7G.

Initially, prior to time point 282, a low voltage or logic high signal exists at the input terminal 105 of the driver circuit 100a, and a logic low output signal 103 exists at output pad 104, as shown in FIGS. 7A and 7G, respectively. The low to high transition of the input signal 105 at time point 282 results in a logic high signal (FIG. 7B) at the input terminals of NOR gates 228a, 228b, 228c and 228n, thereby disabling those NOR gates and allowing the delay circuit 112a to solely control the slew rate of the output signal transitioning from the low to high states. The logic high signal at one of the input terminals to the NOR gates 228a, 228b, 228c and 228n disables them, because low level signals are required at their inputs for a high level output signal to be generated. Only a high level output signal from the NOR gates 228a, 2228b, 228c and 228n will have an effect on the OR gates 206a, 206b, 206c and 206n, respectively.

As a result of the logic high signal at time point 282 at the input terminal of inverter 200, a logic low signal occurs at the gate of transistor 202 and at the input terminal of delay element 212a. The low level signal biases the transistor 202 into a nonconductive condition, at time point 282, allowing the voltage of the output signal 103 (FIG. 7G) to start rising at time point 282. The output signal 103 starts to rise because the switching circuit 110a is no longer as effective in dissipating energy supplied by the pole of circuit 108 (FIG. 1). Because the logic high-signal (FIG. 7B) at input terminals of the NOR gates 228a, 228b, 228c and 228n, has disabled the sensing feedback circuit 114a, turning off the remaining drive transistors 204a, 204b, 204c and 204n will be controlled by signals (FIGS. 7C–7F) from the output terminals of delay elements 212a, 212b, 212c and 212n, respectively.

At a predetermined time point 284 after a logic low has been asserted on the input terminal of delay element 212a, a signal (FIG. 7C) at the output terminal of delay element 212a will go low, thus asserting a logic low signal on the input terminal of delay element 212b and on the input terminal of the OR gate 206a. The signal from the output terminal of OR gate 206a will then go low, thereby turning off transistor 204a. As a result of transistor 204a turning off, a further voltage rise of the output signal 103 will occur at time point 284 (FIG. 7G).

At a predetermined time point 286 after a logic low has been asserted on the input terminal of delay element 212b, a signal (FIG. 7D) at the output terminal of delay element 212b will go low, thus asserting a logic low signal on the input terminal of delay element 212c and on the input terminal of the OR gate 206b. The signal from the output terminal of OR gate 206b will then go low, thereby turning off transistor 204b. As a result of transistor 204b turning off, a further voltage rise of the output signal 103 will occur at time point 286 (FIG. 7G).

At a predetermined time point 288 after a logic low has been asserted on the input terminal of delay element 212c, a signal (FIG. 7E) at the output terminal of delay element 212c will go low, thus asserting a logic low signal on the input terminal of delay element 212n and on the input terminal of the OR gate 206c. The signal from the output terminal of OR gate 206c will then go low, thereby turning off transistor 204c. As a result of transistor 204c turning off, a further voltage rise of the output signal 103 will occur at time point 288 (FIG. 7G).

Finally, at a predetermined time point 290 after a logic low signal has been asserted on the input terminal of delay element 212n, a signal (FIG. 7F) at the output terminal of delay element 212n will go low, thus asserting a logic low signal at the input terminal of the OR gate 206n. The signal (FIG. 7F) at the output terminal of OR gate 206n will then go low, thereby turning off transistor 204n and allowing a further voltage of the output signal 103 to rise even further.

After the drive transistors 202, 204a, 204b, 204c and 204n have all been turned off, the output signal 103 (FIG. 7G) will be at a logical high 270.

The preceding examples illustrate the function of the output signal pad cell driver circuit 100a as it relates to the timing of turning on and off the drive transistors 202, 204a, 204b, 204c and 204n of the switching circuit 110a. The output waveform of circuit 100a can also be contoured by selecting the size of transistors 202, 204a, 204b, 204c and 204n. For example, if transistors 202, 204a, 204b, 204c and 204n are selected to be of increasing size, respectively, the shape of a falling output signal waveform 103b, such as that shown in FIG. 8, may be achieved. Conversely, if transistors 202, 204a, 204b, 204c and 204n are selected to be of decreasing size, respectively, the shape of a falling output signal waveform 103a, such as that shown in FIG. 9, may be achieved. The ability to shape the output waveform of circuit 100*a* is particularly important in instances where strict output waveform specifications are required.

By carefully selecting the trip points of comparators 224*a*, 224*b*, 224*c* and 224*n*, the delay times of delay elements 212*a*, 212*b*, 212*c* and 212*n*, the delay times of feedback delay elements 226*a*, 226*b*, 226*c* and 226*n*, as well as the size of the drive transistors 202, 204*a*, 204*b*, 204*c* and 204*n*, the waveform and slew rate of the output signal 103 at the output pad 104 can be controlled with precision variety. Additionally, resistors 222*a*, 222*b*, 222*c* and 222*n* may be utilized, together with the inherent capacitances of the output signal pad cell driver circuit 100*a* and the inherent capacitance of the load connected to the pad cell 104, to provide an additional time delay component to the delay feedback circuits 220*a*, 220*b*, 220*c* and 220*n*.

A second embodiment 100*b* of the output signal pad cell driver circuit of the present invention is shown in FIG. 10. The output signal pad cell driver circuit 100*b* comprises a switching circuit 110*b*, a delay circuit 112*b*, and a sensing feedback delay circuit 114*b*, which contain similar components having the same reference numbers as those previously used to describe the driver circuit embodiment 100*a* (FIG. 4). The switching circuit 110*b* is substantially identical in structure and function to switching circuit 110*a* (FIG. 4). A logic low signal asserted at the input of inverter 200 will cause a logic high signal on the gate of transistor 202, thereby turning on transistor 202 and causing a voltage drop of the output signal at output pad 104. However, unlike driver circuit embodiment 100*a* (FIG. 4), the sensing feedback delay circuit 114*b* exclusively controls the turning on of the driver transistors 202, 204*a*, 204*b*, 204*c* and 204*n* and the delay circuit 112*b* exclusively controls the turning off of the transistors 202, 204*a*, 204*b*, 204*c* and 204*n* of the switching circuit 110*b*.

The delay circuit 112*b* is similar to the delay circuit 112*a* (FIG. 4) in regard to the structure of the delay elements 212*a*, 212*b*, 212*c* and 212*n*. Additionally however, the delay circuit 112*b* additionally includes four AND gates 304*a*, 304*b*, 304*c* and 304*n*. The output terminal of each delay element 212*a*, 212*b*, 212*c* and 212*n* is connected to an input terminal of the associated AND gate 304*a*, 304*b*, 304*c* and 304*n*, respectively. An output terminal of each AND gate 304*a*, 304*b*, 304*c* and 304*n* is connected to an input terminal of an associated OR gate 206*a*, 206*b*, 206*c* and 206*n*, respectively. The other input terminal of each AND gate 304*a*, 304*b*, 304*c* and 304*n* is connected to the input terminal 105 of the driver circuit 110*b*.

When a logic low signal is asserted at the input terminal 105, that logic low signal will also be asserted on the input terminals of the AND gates 304*a*, 304*b*, 304*c* and 304*n*. A logic low signal on the input terminals of the AND gates 304*a*, 304*b*, 304*c* and 304*n* will prevent the assertion of a logic high signal from the AND gates 304*a*, 304*b*, 304*c* and 304*n*. Therefore, delay circuit 112*b* is effectively disabled as a result of a transition of the input signal 105 from a logic high to a logic low state. Instead, the sensing feedback delay circuit 114*b* exclusively controls the switching on of the drive transistors 202, 204*a*, 204*b*, 204*c* and 204*n*. Similarly, when a logic high signal at the input terminal 105 is applied to one input terminal of the NOR gates 228*a*, 228*b*, 228*c* and 228*n*, those NOR gates prevent logic high signals from being conducted through them, thereby disabling the sensing feedback delay circuit 114*b* from turning off the transistors 204*a*, 204*b*, 204*c* and 204*n*. Instead, the sensing feedback delay circuit 112*b* exclusively controls the switching off of the drive transistors 202, 204*a*, 204*b*, 204*c* and 204*n*.

The sensing delay feedback circuit 114*ba* comprises four principal sub-circuits, a slew rate detection circuit 308, a slow delay circuit 310, a fast delay circuit 312, and a selection circuit 314. In general, slew rate detection circuit 308 samples the initial slew rate of a falling output signal at output pad 104. If a relatively slow slew rate is detected by the detection circuit 308, indicating a relatively heavy load or large capacitance is connected to the output pad 104, delay circuit selection circuit 314 enables the fast delay circuit 312 to sequentially turn on the drive transistors 204*a*, 204*b*, 204*c* and 204*n* of the switching circuit 110*b*. If a relatively fast slew rate is detected, indicating a relatively light load or small capacitance is connected to the output pad 104, the selection circuit 314 enables the slow delay circuit 312 to sequentially turn on the drive transistors 204*a*, 204*b*, 204*c* and 204*n* of the switching circuit 110*b*. Thus, the slew rate is controlled to be more constant without substantial dependency on the amount of load or impedance connected to the output pad 104.

The slew rate detection circuit 308 comprises a resistor 316, a comparator 318, an XOR gate 320, a 2-to-1 line multiplexer 322, a 4-bit counter 324 and a 16-pulse generator 326. One terminal of resistor 316 is connected to output pad 104 of pad circuit 100*b*, while the other terminal of resistor 316 is connected to the variable voltage input terminal of comparator 318. The output terminal of comparator 318 is connected to an input terminal of a first slow delay element 330*a*, an input terminal of a first fast delay element 332*a*, and an input terminal of an XOR gate 320. The comparator 318 is preferably set to trip, or turn on, and produce a high logic state at its output terminal at a predetermined input trip point voltage. Conversely, comparator 318 will turn off and produce a logic low signal at its output terminal when the voltage at the input of comparator 318 falls below the trip point.

One input terminal of the XOR gate 320 is connected to the output terminal of comparator 318. The other input terminal of the XOR gate 320 is connected to the input terminal 105. The output terminal of the XOR gate 320 is connected to a select line of the multiplexor 322. When a logic high signal is present on only one input terminal of XOR gate 320, a logic high will be present at the output terminal of XOR gate 320. Any other combinations of logic high signals and/or logic low signals on the input terminals of XOR gate 320 will produce a logic low at the output terminal of XOR gate 320.

The multiplexor 322 is a 2-to-1 multiplexor, having one input connected to ground reference, and other input connected to an output terminal of the pulse generator 326, a select line connected to the output terminal of the XOR gate 320, and an output terminal connected to an input terminal of the counter 324. The ground-connected input terminal of the multiplexor 322 is thereby held permanently at a logic low level. When a logic low signal is asserted on the select line of multiplexor 322 from XOR gate 320, the logic low signal from the ground reference input to the multiplexor 322 will be directed from the output terminal of multiplexor 322 to the counter 324. When a logic high is asserted on the select line from the XOR gate 320, signals from the pulse generator 326 will be directed from the output terminal of multiplexor 322 to the counter 324.

The counter 324 has one input terminal which is connected to the output terminal of the multiplexor 322, one reset terminal which is connected to the input terminal 105, and four output terminals. One output terminal 344 of the counter 324 is connected to a select line of each multiplexor 334*a*, 334*b*, 334*c* and 334*n* of the select circuit 314. The reset terminal of the counter 324 is connected to the input terminal 105. The counter 324 will start counting pulses supplied at its input terminal from the multiplexor 322 and generated by the pulse generator 326 when a logic low signal is present on its reset line. The counter 324 will ignore signals at its input terminal when a logic high signal is present at its reset line. Thus counter 324 is enabled when an input signal at terminal 105 is at a logic low level, which is the condition when the sensing feedback circuit 114b becomes operative.

An input terminal of the pulse generator 326 is also connected to the input terminal 105. When a logic low level signal is asserted on the input terminal 105, the pulse generator 326 generates a sequence of 16 pulses, which are supplied to the multiplexor 322. Thus, when the input signal at the terminal 105 transitions from a high level to a low level, the low level signal causes the pulse generator 326 to commence generating the sequence of pulses. When a logic high signal is asserted on the input terminal of the pulse generator 326, the pulse generator 326 is inoperative to generate output pulses.

The slow delay circuit 310 comprises multiple time delay elements 330a, 330b, 330c and 330n, connected in series. The time delay invoked by each of the delay elements 330a, 330b, 330c and 330n is relatively long. The fast delay circuit 312 also comprises multiple time delay elements 332a, 332b, 332c and 332n, connected in series. The time delay invoked by each of the delay elements 332a, 332b, 332c and 332n is relatively short.

The multiplexors 334a, 334b, 334c and 334n of the selection circuit 314 are all 2-to1 multiplexors, having two inputs terminals, one output terminal and one select line. One input terminal of each multiplexor 334a, 334b, 334c and 334n is connected to an output terminal of an associated slow delay element 330a, 330b, 330c and 330n, respectively, and the other input terminal of each multiplexer 334a, 334b, 334c and 334n is connected to an output terminal of an associated fast delay element 332a, 332b, 332c and 332n, respectively. The output terminal of each multiplexor 334a, 334b, 334c and 334n is connected respectively to one input terminal of the NOR gates 228a, 228b, 228c and 228n. The select lines of the multiplexors 334a, 334b, 334c and 334n are commonly connected to the output terminal 342 of the counter 324.

When a logic low signal is asserted on the select line of the multiplexors 334a, 334b, 334c, or 334n, from terminal 342 of the counter 324, the signals from the slow delay elements 330a, 330b, 330c and 330n are directed to the output terminal of that multiplexor. When a logic high is asserted on the select line of the multiplexors 334a, 334b, 334c, or 334n, the signals from the fast delay elements 332a, 332b, 332c and 332n are directed to the output terminals of those multiplexors.

Details regarding the operation of the output signal pad cell driver circuit 110b shown in FIG. 10 are described together with FIGS. 11A through 11K, FIGS. 12A through 120, and FIGS. 13A through 13L.

FIGS. 11A through 11K illustrate waveforms at various points in the output signal pad cell driver circuit 100b (FIG. 10) when output pad 104 of the circuit 100b is connected to a relatively heavy load or high capacitance. Prior to time point 350, a high voltage or logic high input signal 105 exists at the input terminal and a high voltage or high logic output signal 103 exists at the output pad 104, as shown in FIGS. 11A and 11K, respectively. Prior to time point 350, transistors 202, 204a, 204b, 204c and 204n are all nonconductive.

At time point 350, a logic low signal (FIG. 11A) is applied to the input terminals of the AND gates 304a, 304b, 304c and 304n. At the same time point 350, a logic low signal is supplied to the reset terminal of the counter 324, to the input terminal of the generator 326, to one input terminal of the XOR gate 320, and to one input terminal of the NOR gates 228a, 228b, 228c and 228n. The logic low signal at the input terminals of the AND gates 304a, 304b, 304c and 304n prevents them from conducting logic high signals, thereby disabling the delay circuit 112b from turning on transistors 204a, 204b, 204c and 204n.

Prior to the time point 350, the output signal 103 at the output pad 104 is at a logic high level above trip point of the comparator 318, causing the comparator 318 to assert a logic high signal (FIG. 11D) at one input terminal of the XOR gate 320 and at the input terminals of the slow delay element 330a and the fast delay element 332a. When a logic low signal occurs at point 350 (FIG. 11A), and consequently on the input terminal of XOR gate 320, a logic high signal will be asserted (FIG. 11E) at the output terminal of XOR gate 320 and on the select line of multiplexor 322. The logic high signal on the select line of the multiplexor 322 will cause signals at the input terminal of the multiplexor 322 to be directed to the counter 324.

The logic low signal asserted after time point 350 (FIG. 11A) causes the inverter 200 to deliver a logic high signal to the gate of transistor 202, turning on the transistor 202. Transistor 202 causes an initial voltage drop of the output signal (FIG. 11K) at time point 350 and at the input terminal of comparator 318. When the input voltage to the comparator 318 has dropped below the trip point at time point 352, a logic low signal (FIG. 11D) is asserted at the input terminal of XOR gate 320, at the input terminal of fast delay element 330a, and at the input terminal of slow delay element 332a.

Also occurring at time point 350, the logic low signal at the input terminal of the generator 326 causes the generator 326 to generate a sequence of pulses (FIG. 11B). The series of pulses is conducted through the multiplexor 322 and causes the similar sequence of pulses (FIG. 11F) at the input to the counter 324. The output signal from terminal 342 of the counter 324 is initially low. However, after eight pulses (when the counter 324 is a four bit counter) have been counted, the signal from the terminal 342 goes high at time point 354 as shown at FIG. 11C. A logic high signal (FIG. 11C) is then asserted after time point 354 on the select lines of the multiplexors 334a, 334b, 334c and 334n. In response, the multiplexors 334a, 334b, 334c and 334n select signals from the output terminals of the fast delay elements 332a, 332b, 332c and 332n, respectively, and pass those selected signals to the NOR gates 228a, 228b, 228c and 228n.

The logic low input signal 105 and the logic low signal from the comparator 318 at the input terminals of the XOR gate 320 will cause a logic low signal at the output terminal of XOR gate 320 after time point 352 (FIG. 11E), thus asserting a logic low signal on the select line of multiplexor 322. The logic low signal from the multiplexor 322 then causes the logic low signal at the grounded input terminal of multiplexor 322 to be delivered to the input terminal of counter 324 after time point 352 as shown in FIG. 11F. The output signal (FIG. 11C) at terminal 342 from the counter 324 will, however, remain at a high level until a logic high signal is asserted on the reset line of the counter 324.

At a predetermined time delay at the time point 356 (FIG. 11G) after the time point 352, after the comparator 318 has asserted a logic low signal, the fast delay element 332a supplies a logic low signal at time point 356 (FIG. 11G). At time point 352, the multiplexor 334a passes the logic low signal from the fast delay element 332a to the NOR gate 228a. Since the other input signal to the NOR gate 228a is at a logic low level, both input signals to the NOR gate 228a are now at logic low levels, causing the output signal from the NOR gate 228a to go to a logic high level. The logic high output signal from the NOR gate 228a is asserted as a logic high signal on the input terminal of the OR gate 206a, is conducted through the OR gate 206a to bias the transistor 204a into conduction at time point 356 (FIG.11G). As a result of transistor 204a turning on, a further voltage drop of the output signal 103 (FIG. 11K) occurs at time point 356.

A predetermined time after the output signal from the fast delay element 332a goes low at time point 356, an output signal from the fast delay element 332b will go low at time point 358 (FIG. 11H). At time point 358, the multiplexor 334b passes the output signal from the fast delay element 332b to one input terminal of the NOR gate 228b. The other input signal to the NOR gate 228b is also low as a result of the low input signal 105. The output signal from the NOR gate 228b will now go high, thus asserting a logic high signal on the input terminal of the OR gate 206b. The high output signal from the OR gate 206b biases the transistor 204b into conduction at time point 358, causing a further voltage drop in the output signal 103 (FIG. 11K).

At a predetermined time point 360 after the output signal from the fast delay element 330b goes low, the fast delay element 332c supplies an output logic low signal at time point 360 (FIG. 11). At time point 360, the multiplexor 334c passes the logic low signal from the fast delay element 332c to the NOR gate 228c. A high output signal from the NOR gate 228c is applied to the OR gate 206c and to the gate of the transistor 204c, thus turning on the transistor 204c. The conductive transistor 204c causes a further drop in the voltage of the output signal 103 (FIG. 11K) at time point 360.

Finally, at a predetermined time point 362 (FIG. 11J) after the output signal from the fast delay element 332n goes to a logic low level, the fast delay element 332n supplies a logic low signal (FIG. 11J). At time point 362 the multiplexor 334n passes the logic low output signal from the fast delay element 332n to an input terminal of the NOR gate 228n. The logic high output signal from the NOR gate 228c, resulting from the two logic low input signals delivered to it, is applied to the OR gate 206n and to the gate of transistor 204n. The transistor 204n becomes conductive, causing a further drop in the voltage of the output signal 103 at time point 362 (FIG.11K).

At time point 362 all of the driver transistors 202, 204a, 204b, 204c and 204n are conductive, and the output signal 103 is at a logic high level (FIG. 11K). Because the fast delay elements 332a, 332b, 332c and 332n control the rate at which the driver transistors 204a, 204b, 204c and 204n becomes conductive, the slew rate of the output signal 103 is relatively high, transitioning between the logic high level at time point 350 and the logic low level at time point 362 (FIG. 11K).

The operation of the output signal pad cell driver circuit 100b (FIG. 10) when a relatively light load or low capacitance is connected to the output pad 104 is similar to the function described when a relatively heavy load or low impedance is connected to the output pad 104, as has been described in FIGS. 11A to 11K. However, as shown in FIGS. 12A to 12K which illustrate the operation of the output signal pad cell driver circuit 100b when connected to a relatively light load or low capacitance, the driver transistors 204a, 204b, 204c and 204n will be biased into a conductive state at different time intervals, thus causing the output signal 103 (FIG. 12K) to assume a more rapid slew rate. The differences in functionality of the driver circuit 100b will be highlighted in the following description of FIGS. 12A through 12K, compared to description associated with FIGS. 11A through 11K.

When a relatively light load is connected to the output pad 104, the slew rate of the output signal 105 (FIG. 12K) will be faster than when a relatively heavy load is connected to the output pad 104. This relatively quick drop in the output voltage 103 (FIG. 12K) will cause the trip point of comparator 318 to be reached in a shorter amount of time than would be the case if a relatively heavy load were connected to output pad 104. Because the counter 324 will not have counted a sufficient number of pulses to create an output signal at terminal 342 to the select lines of the multiplexors 334a, 334b, 334c and 334n before the trip point of the comparator 318 is reached, a logic low signal is asserted by the comparator 318 to the input terminal of XOR gate 320, at time point 364 (FIG. 12C). The assertion of the logic low signal from the XOR gate 320 will cause a logic low to be asserted on the select line of multiplexor 322, thus causing the grounded logic low signal to be directed through the multiplexor 322 and to the input terminal of the counter 324. Since eight pulses have not been counted by counter 324 at time point 364, the output signal (FIG. 12C) from the counter 324 will remain low, leaving a logic low signal on the select lines of multiplexors 334a, 334b, 334c and 334n. In response to the logic low signal on their select lines, the multiplexors 334a, 334b, 334c and 334n select the output signals from the slow delay elements 330a, 330b, 330c and 330n, respectively, to pass to the NOR gates 228a, 228b, 228c and 228n, respectively.

At a predetermined time point 366, the transistor 204a will turn on, dropping the voltage of the output signal 103 (FIG. 12K). At the sequentially occurring delayed time points 368, 370 and 372, the driver transistors 204b, 204c and 204n will become conductive, further diminishing the voltage of the output signal 103 (FIG. 12K), in a similar manner as has been previously described in conjunction with FIGS. 11A–11K. After transistors 202, 204a, 204b, 204c and 204n have all been turned on, the output signal 103 will be at a logic low state (FIG. 12K).

The output signals from the fast delay elements 332a, 332b, 332c and 332n will go low in a similar, although somewhat faster, sequential manner as the output signals from the slow delay elements 330a, 330b, 330c and 330n. However, the multiplexors 334a, 334b, 334c and 334n do not pass the output signals from the fast delay elements, thus preventing them from having an affect on the circuit 100b. The initial steep decline of the output signal 103 between time points 350 and 366, as shown in FIG. 12K, compared to the decline of the output signal 103 between time points 350 and 356 as shown in FIG. 11K, is primarily a result of the relatively low capacitance loading which is connected to the output pad 104 under the circumstances represented in FIGS. 12A to 12K. The lower capacitance loading allows the output signal 103 to change more rapidly.

FIGS. 13A through 13L illustrate waveforms at various points in the output signal pad cell driver circuit 100b as the driver transistors 202, 204a, 204b, 204c and 204n are being turned off, in response to the output signal 103 transitioning from a logic low state to a logic high state.

Initially, prior to time point 380 (FIG. 13A), a logic low input signal 105 exists at the input terminal of the driver circuit 100b and at the input terminals of the AND gates 304a, 304b, 304c and 304n and the NOR gates 228a, 228b, 228c and 228n. A logic high signal (FIG. 13B) exists at the gate of transistor 202, causing it to be conductive. The remaining drive transistors 204a, 204b, 204c and 254n are also conductive because of the two low logic level input signals to the NOR gates 228a, 228b, 228c and 228n. The output signals from the AND gates 304a, 304b, 304c and 304n are all low.

Beginning at time point 380, a logic high input signal 105 is applied to the input terminal of the inverter 200, and to the input terminals of the NOR gates 228a, 228b, 228c and 228n, and to the input terminals of the AND gates 304a, 304b, 304c and 304n. A logic low signal from the inverter 200 terminates the bias to the transistor 202, causing it to become nonconductive at time point 380 (FIG. 13G). When the transistor 202 becomes nonconductive, the voltage of the output signal 103 (FIG. 13L) to begin rising at time point 380. The logic high signal at the input terminals of the NOR gates 228a, 228b, 228c and 228n, prevents those NOR gates from conducting signals from the sensing feedback delay circuit 114b, thereby disabling it from influencing the slew rate during the transition from the logic low state to the logic high state. The logic high signal at one input terminal of the AND gates 304a, 304b, 304c and 304n readies those AND gates to respond to signals from the delay elements 212a, 212b, 212c and 212n.

The logic low signal from the inverter 200 is applied to the input terminal of the delay element 212a, at time point 380. After a predetermined time delay to time point 382 (FIG. 13C), the output signal from the delay element 212a will go low, thus asserting a logic low on the other input terminal of the AND gate 304a. The logic low signal applied to the AND gate 304a causes a logic low signal to be supplied to the OR gate 206a, thus removing the bias signal from the drive transistor 204a and causing it to become nonconductive at time point 382 (FIG. 13H). As a result of transistor 204a turning off, a further rise in the output signal 103 will occur (FIG. 13L).

After a predetermined time delay to time point 384 (FIG. 13D) after a logic low was asserted on the input terminal of delay element 212b at time point 382, the output signal from the delay element 212b will go low (FIG. 13D) thus asserting a logic low on the input terminal of the AND gate 304b. The logic low signal from the AND gate 304b causes the OR gate 206b to remove the bias signal to the transistor 204b, thereby turning it off at time point 384 (FIG. 13I). The voltage of the output signal 103 rises at time point 384 (FIG. 13L) as a result of transistor 204b turning off.

After a predetermined time delay to time point 386 (FIG. 13E) after a logic low was asserted on the input terminal of delay element 212c at time point 384, the output signal from the delay element 212c will go low (FIG. 13E) thus asserting a logic low on the input terminal of the AND gate 304c.The logic low signal from the AND gate 304c causes the OR gate 206c to remove the bias signal to the transistor 204c, thereby turning it off at time point 386 (FIG. 13J). The voltage of the output signal 103 rises at time point 384 (FIG. 13L) as a result of transistor 204c turning off.

Finally, after a predetermined time delay to time point 388 (FIG. 13F) after a logic low was asserted on the input terminal of delay element 212n at time point 386, the output signal from the delay element 212n will go low (FIG. 13F) thus asserting a logic low on the input terminal of the AND gate 304n. The logic low signal from the AND gate 304n causes the OR gate 206n to remove the bias signal to the transistor 204n, thereby turning it off at time point 388 (FIG. 13K). The voltage of the output signal 103 rises (FIG. 13L) as a result of transistor 204b turning off.

By predetermining the trip points of the comparators employed in both embodiments 100a and 100b of the present invention, as well as the delay times of the delay elements and the sizes of the driver transistors, the waveform shape and slew rate of the output signal 103 at the output pad 104 can be very effectively controlled. By sensing the initial slew rate and selecting the appropriate delay elements according to the initially sensed slew rate, the problems of overshoot, undershoot and ringing are avoided while simultaneously maintaining the slew rate within standards and limits to meet various specifications and protocols. Similarly, by maintaining the slew rate at a desired level, the problems of faults and unreliable signals within a digital logic system are avoided. The integrated circuit in which the present invention is incorporated is also more easily used in a variety of applications, because the output signal pad cell driver circuit of the present invention accommodates a wider range of output loading conditions while still maintaining the slew rate more consistently over a wider range of loads and within desired limits and ranges. Many other improvements and advantages will be apparent after gaining a full understanding of the present invention.

Presently preferred embodiments of the present invention have been shown and described with a degree of particularity. These descriptions are of preferred examples of the invention. In distinction to its preferred examples, it should be understood that the scope of the present invention is defined by the scope of the following claims, which should not necessarily be limited to the detailed description of the preferred embodiments set forth above.

What is claimed is:

1. An output signal pad cell driver circuit of an integrated circuit for controlling the slew rate of a digital logic output signal delivered from an output pad of the integrated circuit in relation to a load connected to the output pad, the output signal occurring in response to an input digital logic signal to said driver circuit, said driver circuit comprises:

a first timing circuit for generating a first predetermined plurality of first trigger signals which occur in a first sequence at sequentially spaced time intervals with respect to one another;

a second timing circuit for generating a second predetermined plurality of second trigger signals which occur in a second sequence at sequentially spaced time intervals with respect to one another in the first and second sequences, respectively;

the first and second predetermined pluralities of trigger signals being equal in number;

the first trigger signals of the first sequence and the second trigger signals of the second sequence correlating to one another;

the time intervals between the first trigger signals in the first sequence being different from the time intervals between the second trigger signals in the second sequence;

the first timing circuit responds to the input signal to initiate the generation of the first plurality of first trigger signals;

the second timing circuit responds to the output signal under influence of the load connected to the output pad to initiate the generation of the second plurality of second trigger signals;

a plurality of logic gates, the plurality of logic gates equal in number to the number of first and second trigger signals in the first and second sequences, respectively;

each logic gate receiving the correlated first and second trigger signals and supplying a selected one of the correlated first and second trigger signals which occupies a predetermined temporal relationship to the other trigger signal received at each logic gate; and a switching circuit comprising a plurality of drive switches connected to the output pad, each drive switch connected to a different logic gate to receive the selected one of the first and second trigger signals, the selected one of the trigger signals applied from each logic gate controlling the conductivity of each drive switch to establish the slew rate of the output signal.

2. A driver circuit as defined in claim 1 wherein:

each logic gates selects the one of the correlated first and second trigger signals based on a predetermined temporal relationship in which the correlated first and second trigger signals are applied to the logic gate.

3. A driver circuit as defined in claim 1 wherein:

the first timing circuit is responsive to a change in the input signal from one logic level to another logic level to initiate generation of the first sequence of first trigger signals; and the second timing circuit is responsive to a change in the output signal relative to time to initiate generation of the second sequence of second trigger signals.

4. A driver circuit as defined in claim 3 wherein:

the first timing circuit includes a plurality of first timing elements connected in series, and each first timing element generates a first trigger signal at a time interval after a preceding first timing element in the series generates a first trigger signal.

5. A driver circuit as defined in claim 4 wherein:

the second timing circuit includes a plurality of control gates receptive of a signal related to the input signal and operative to conduct each second trigger signals to each logic circuit in response to the signal related to the input signal.

6. A driver circuit as defined in claim 1 wherein:

one of the first and second trigger signals controls the conductivity of the drive switches in response to a transition of the input signal from a logic low state to a logic high state and the other one of the first and second trigger signals controls the conductivity of the drive switches in response to a transition of the input signal from a logic high state to a logic low state.

7. A driver circuit as defined in claim 3 wherein:

the second timing circuit includes a plurality of second timing elements connected in series; and each second timing element generates a second trigger signal at a time interval after a preceding second timing element in the series generates a second trigger signal.

8. An output signal pad cell driver circuit of an integrated circuit for controlling the slew rate of a digital logic output signal delivered from an output pad of the integrated circuit in relation to a load connected to the output pad, the output signal occurring in response to an input digital logic signal to said driver circuit, said driver circuit comprises:

a first timing circuit responsive to a change in the input signal from one logic level to another logic level to initiate generating a plurality of first trigger signals which occur at sequentially spaced time intervals with respect to one another;

a second timing circuit responsive to a change in the output signal relative to time under influence by the load connected to the output pad to initiate generating a plurality of second trigger signals which occur at sequentially spaced time intervals with respect to one another and at time intervals different from the time intervals of the first trigger signals; and a switching circuit comprising a plurality of drive switches connected to the output pad and responsive to the first and second trigger signals, the trigger signals controlling the conductivity of the drive switches in relation to the occurrence of those trigger signals to establish the slew rate of the output signal; and wherein the second timing circuit includes a plurality of timing elements connected in series which each generate a second trigger signal, each series-connected timing element generating its second trigger signal at a time interval after the preceding series-connected timing element generates its second trigger signal; and the second timing circuit further includes a comparator connected to the output pad and receptive of the output signal, the comparator having a trip point level at which a trip point signal is delivered, and the comparator delivering the trip point signal to the plurality of series-connected timing elements of the second timing circuit.

9. A driver circuit as defined in claim 8 wherein:

the second timing circuit further includes a first plurality of fast delay elements connected in series and a second plurality of slow delay elements connected in series;

the comparator delivers the trip point signal to both the first and second pluralities of the series-connected fast and slow delay elements, respectively; and the second timing circuit further includes a multiplexer receptive of the trigger signals generated by the first and second pluralities of series-connected fast and slow delay elements, the multiplexer operatively selecting one of the trigger signals from the fast delay elements or the trigger signals from the slow delay elements for application to the switching circuit.

10. A driver circuit as defined in claim 9 wherein:

the second timing circuit further includes a pulse generator for generating a plurality of timing pulses, and a counter for counting a predetermined number of the plurality of timing pulses generated by the pulse generator and for delivering a count signal upon counting the predetermined number of timing pulses; and the multiplexer responds to the count signal by conducting trigger signals from the fast delay elements to the switching circuit prior to the occurrence of the count signal and by conducting trigger signals from the slow delay elements to the switching circuit after the occurrence of the count signal.

11. A driver circuit as defined in claim 10 wherein:

the second timing circuit includes a plurality of logic gates connected to the multiplexer and operative to conduct trigger signals from the multiplexer to the switching circuit in response to the input signal having a predetermined logic level.

12. An output signal pad cell driver circuit of an integrated circuit for controlling the slew rate of a digital logic output signal delivered from an output pad of the integrated circuit in relation to a load connected to the output pad, the output signal occurring in response to an input digital logic signal to said driver circuit, said driver circuit comprises:

a first timing circuit responsive to a change in the input signal from one logic level to another logic level to initiate generating a plurality of first trigger signals which occur at sequentially spaced time intervals with respect to one another;

a second timing circuit responsive to a change in the output signal relative to time under influence by the load connected to the output pad to initiate generating a plurality of second trigger signals which occur at sequentially spaced time intervals with respect to one another and at time intervals different from the time intervals of the first trigger signals, the second timing circuit including a plurality of timing elements which each generate a second trigger signal; and a switching circuit comprising a plurality of drive switches connected to the output pad and responsive to the first and second trigger signals, the trigger signals controlling the conductivity of the drive switches in relation to the occurrence of those trigger signals to establish the slew rate of the output signal; and wherein the second timing circuit further includes a plurality of comparators connected to receive a signal from the output pad, one comparator connected to each timing element, each comparator having a trip point level at which a trip point signal is delivered, each comparator having a different trip point level from the other trip point levels of the other comparators, and each comparator delivering its trip point signal to its connected timing element at a different time established by its trip point level and the rate of change of the output signal.

13. A driver circuit as defined in claim 12 wherein:

the second timing circuit includes a plurality of logic gates connected to the timing elements and operative to conduct trigger signals to the switching circuit in response to the input signal having a predetermined logic level.

14. A driver circuit as defined in claim 1 wherein:

the second timing circuit includes a plurality of logic gates connected to conduct trigger signals from the multiplexer to the switching circuit only in response to the input signal having one predetermined logic level.

15. A driver circuit as defined in claim 1 wherein:

each of the drive switches has a different conductivity capacity, and the conductivity capacity of the drive switches changes in relation to the sequence in which the trigger signals are applied to the drive switches.

16. A method of controlling the slew rate of a digital logic output signal delivered from an output pad of an integrated circuit relative to a load connected to the output pad, in response to the occurrence of an input digital logic signal, said method comprising:

generating a first predetermined plurality of first trigger signals in a first sequence at sequentially spaced time intervals with respect to one another, in response to the occurrence of the input signal;

generating a second predetermined plurality of second trigger signals in a second sequence at sequentially spaced time intervals with respect to one another, in response to the influence of the load connected to the output pad on the output signal;

generating a number of first trigger signals in the first sequence which is equal to the number of second trigger signals in the second sequence;

correlating first and second triggers signals at corresponding locations in the first and second sequences;

establishing the time intervals between the first trigger signals in the first sequence as different from the time intervals between the second trigger signals in the second sequence;

selecting one of the first and second correlated trigger signals at corresponding locations in the first and second sequences;

connecting a plurality of conductivity elements to the output pad;

applying the selected one of the correlated first and second trigger signals to a different conductivity element; and changing the level of the output signal at the output pad by changing the conductivity of a conductivity element connected to the output pad in relation to the selected one trigger signal applied to the conductivity element.

17. A method as defined in claim 16 further comprising:

selecting the one of the correlated first and second trigger signals based on a predetermined temporal relationship in which the first and second correlated trigger signals occur with respect to one another.

18. A method as defined in claim 16 further comprising:

responding to a change in the output signal to initiate generation of one plurality of trigger signals while responding to a change in the input signal to initiate delivery of the other plurality of trigger signals.

19. A method as defined in claim 16 further comprising:

controlling the application of the selected ones of the correlated trigger signals to the conductivity elements in relation to one of a transition of the input signal from a logic low state to a logic high state or a transition of the input signal from a logic high state to a logic low state.

20. A method as defined in claim 16 further comprising:

delaying for a predetermined time after the occurrence of the input signal before generating one of the pluralities of trigger signals.

21. A method of controlling the slew rate of a digital logic output signal delivered from an output pad of an integrated circuit relative to a load connected to the output pad, in response to the occurrence of an input digital logic signal, said method comprising the steps of:

generating a plurality of first trigger signals at sequentially spaced time intervals with respect to one another, in response to the occurrence of the input signal;

generating a plurality of second trigger signals at sequentially spaced time intervals with respect to one another and at time intervals different from the time intervals of the first trigger signals;

adjusting at least one of the time intervals between the first and second trigger signals or the temporal occurrence of the first and second trigger signals in relation to the load connected to the output pad;

selecting one of the pluralities of the first and second signals;

changing the level of the output signal at the output pad in relation to the occurrence of the selected one plurality of second signals by changing the conductivity of a conductivity element connected to the output pad in relation to each trigger signal; and counting a predetermined time after the occurrence of the input signal at which to select the one of the pluralities of trigger signals.

22. An output signal pad cell driver circuit of an integrated circuit for controlling the slew rate of a digital logic output signal delivered from an output pad of the integrated circuit in relation to a load connected to the output pad, the output signal occurring in response to an input digital logic signal to said driver circuit, said driver circuit comprises:

a first timing circuit responsive to a change in the input signal from one logic level to another logic level to initiate generating a plurality of first trigger signals which occur at sequentially spaced time intervals with respect to one another;

a second timing circuit responsive to a change in the output signal relative to time under influence by the load connected to the output pad to initiate generating a plurality of second trigger signals which occur at sequentially spaced time intervals with respect to one another and at time intervals different from the time intervals of the first trigger signals; and a switching circuit comprising a plurality of drive switches connected to the output pad and responsive to the first and second trigger signals, the trigger signals controlling the conductivity of the drive switches in relation to the occurrence of those trigger signals to establish the slew rate of the output signal;

and wherein the second timing circuit further includes:

a first plurality of fast delay elements connected in series and a second plurality of slow delay elements connected in series;

a multiplexer receptive of the trigger signals generated by the first and second pluralities of series-connected fast and slow delay elements, the multiplexer operatively selecting one of the trigger signals from the fast delay elements or the trigger signals from the slow delay elements for application to the switching circuit.

* * * * *